(12) United States Patent
Furuta et al.

(10) Patent No.: US 7,501,877 B2
(45) Date of Patent: Mar. 10, 2009

(54) SUPERCONDUCTING SINGLE FLUX QUANTUM MODULATOR CIRCUIT

(75) Inventors: Futoshi Furuta, Kokubunji (JP); Kazuo Saitoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 131 days.

(21) Appl. No.: 11/808,337

(22) Filed: Jun. 8, 2007

(65) Prior Publication Data
US 2008/0129368 A1  Jun. 5, 2008

(30) Foreign Application Priority Data
Jun. 9, 2006  (JP) .............................. 2006-160615

(51) Int. Cl.
*H03K 17/92* (2006.01)
(52) U.S. Cl. .................... 327/367; 326/4; 341/133; 341/171
(58) Field of Classification Search ............. 326/3, 326/4; 327/367; 341/133, 155, 171
See application file for complete search history.

(56) References Cited

U.S. PATENT DOCUMENTS

| | | | | |
|---|---|---|---|---|
| 4,051,393 | A | * | 9/1977 | Fulton .................. 327/367 |
| 4,249,094 | A | * | 2/1981 | Fulton .................. 327/367 |
| 5,140,324 | A | | 8/1992 | Przybysz et al. |
| 6,608,518 | B2 | * | 8/2003 | Furuta et al. .......... 327/367 |
| 7,227,480 | B2 | * | 6/2007 | Furuta et al. .......... 341/133 |

FOREIGN PATENT DOCUMENTS

| | | |
|---|---|---|
| JP | 2005-079663 | 8/2003 |
| JP | 2007-005959 | 6/2005 |

OTHER PUBLICATIONS

Likharev, K.K., et al., "RSFQ Logic/Memory: a New Josephson-Junction Technology for Sub-Terahertz-Clock-Frequency Digital Systems", IEEE Transactions on Applied Superconductivity, vol. 1, No. 1, Mar. 1991, pp. 1-28.

(Continued)

*Primary Examiner*—Donovan Lincoln
*Assistant Examiner*—William Hernandez
(74) *Attorney, Agent, or Firm*—Reed Smith LLP; Juan Carlos A Marquez, Esq.

(57) ABSTRACT

Objects of the present invention are to provide an integration circuit which produces no integration leak so that the bit accuracy is improved in a sigma-delta modulation circuit or a delta modulator circuit, which is based on a single flux quantum circuit that uses a flux quantum as an information carrier, and to provide a method for reducing thermal noise and quantization noise. According to the present invention, an integration circuit is formed by Josephson junctions and an inductor to reduce the integration leak, and a plurality of modulator circuits are connected to one another so as to add up each output. As a result, it is possible to reduce the influence of thermal noise exerted upon the bit accuracy, the thermal noise having no correlativity to one another. Moreover, by changing the density or phase of a SFQ pulse to be supplied to the Josephson junctions of the integration circuit, the correlativity of quantization noise between the outputs of the modulator circuits is eliminated so that the bit accuracy is improved.

14 Claims, 13 Drawing Sheets

OTHER PUBLICATIONS

Przybysz, John X., et al., "Josephson Sigma-Delta Modulator for High Dynamic Range A/D Conversion", IEEE Transactions on Applied Superconductivity, vol. 3, No. 1, Mar. 1993, pp. 2732-2735.

Rylov, Sergey V., et al., "Superconducting High-Resolution A/D Converter Based on Phase Modulation and Multichannel Timing Arbitration", IEEE Transactions on Applied Superconductivity, vol. 5, No. 2, Jun. 1995, pp. 2260-2263.

* cited by examiner

SUPERCONDUCTING SINGLE FLUX QUANTUM MODULATOR CIRCUIT

CLAIM OF PRIORITY

The present application claims priority from Japanese application JP2006-160615 filed on Jun. 9, 2006, the content of which is hereby incorporated by reference into this application.

BACKGROUND OF THE INVENTION

1. Field of the Invention

The present invention relates to a single flux quantum circuit, and more particularly to a method for implementing sigma-delta modulation, or delta modulation, for converting an analog signal into a digital signal.

2. Description of the Related Art

SFQ (Single Flux Quantum) circuits handle a single flux quantum ($F0=h/2e=2.07\times10^{-15}$ Weber) as an information carrier. These single flux quantum circuits are superconducting circuits that are characterized by ultrahigh-speed operation whose speed is the order of several tens of gigahertz ($10^9$ Hz) or higher, and low-power property whose level is several microwatts (μW) per gate or lower. On the basis of the principles shown in IEEE Transaction on Applied Superconductivity, Vol. 1, No. 1 (1991) p. 3 (nonpatent literature 1), various kinds of logic gates were developed in the past, and circuits for practical use, in which these logic gates are used in combination, are widely being developed.

The SFQ circuits are applied to A/D (Analog/Digital) converters. In this case, in order to make full use of high speed that is an advantage of the SFQ circuit, an over-sampling method is adopted as a conversion method. To be more specific, an analog signal is sampled/quantized with a frequency that is sufficiently higher than a frequency band (the bandwidth), and with the accuracy of a few bits (this processing is called "oversampling"). Next, the quantized data signal is subjected to signal processing by a decimation filter. As a result, a digital signal with high accuracy is acquired in the required bandwidth. At the time of the quantization, quantization noise which occurs spread out to a band whose frequency is one half a sampling frequency. In addition to it, the quantization noise does not depend on the sampling frequency. Therefore, with the increase in sampling frequency, noise included in the bandwidth of the analog signal can be made smaller. Because of it, by improving a ratio of the sampling frequency to the bandwidth of the input signal (over-sampling ratio), it is possible to increase the conversion accuracy (the bit accuracy). For example, by improving the over-sampling ratio by twice, the bit accuracy is increased by 0.5 bit.

U.S. Pat. No. 5,140,324 (patent document 1) and IEEE Transaction on Applied Superconductivity, vol. 3 (1993) p. 2732 (nonpatent literature 2) disclose a case where an over-sampling method based on a SFQ circuit is the sigma-delta modulation. In addition, IEEE Transaction on Applied Superconductivity, vol. 5 (1995) p. 2260 (nonpatent literature 3) discloses a case where an oversampling method is the delta modulation. Principles of how the conventional sigma-delta and delta modulator circuits operate will be described along these papers.

FIG. 1A is a block diagram illustrating the principles and configuration of a sigma-delta modulator; and FIG. 1B is a block diagram illustrating the principles and configuration of a delta modulator.

A sigma-delta modulator 100 includes an adder circuit 101, an integration circuit 102, a comparator circuit 103, and a one-bit D/A conversion circuit 104. First of all, an analog signal 111 is integrated by the integration circuit 102, and is then inputted into the comparator circuit 103. The result of the comparison is output as a quantized data signal 112 that is a digital signal whose value is "1" or "0". In addition, the result of the comparison is converted into an analog signal by the D/A conversion circuit 104. The analog signal is then fed back to the input side of the integration circuit 102 by the adder circuit 101. As the quantization data signal output that is obtained from the comparator circuit 103, "1" is output. The density of the output "1" is proportional to a signal level of the input signal 111. By calculating this density using a digital filter that is placed in the subsequent stage of the modulator circuit, a digital signal on which the input signal is reflected is acquired.

On the other hand, because the delta modulator does not have an integration circuit in the preceding step of the comparator circuit 103, the analog signal 111 is not subjected to the integration processing. Only a feedback signal received from the comparator circuit 103 is integrated by the integration circuit 102. Because of it, only a change in the analog signal 111 is reflected on the digital signal that is output from the comparator circuit 103. In order to restore from the output signal the digital signal on which the analog signal is reflected, it is necessary to place a digital integrator 105 between the modulator and a digital filter.

These methods have characteristics that the frequency distribution of quantization noise occurring in an A/D conversion process is moved to a frequency band whose frequency is higher than the signal bandwidth to reduce quantization noise within the signal bandwidth. This method for changing the frequency distribution of noise is called "noise shaping". By use of this noise shaping, it is possible to improve the bit accuracy of oversampling more efficiently. For example, by improving an over-sampling ratio by twice, the effect of the noise shaping causes the bit accuracy to increase by 1.0 bits. If the effect of the oversampling described above is included, the bit accuracy increases by 1.5 bits. For this reason, by forming a modulator using the SFQ circuit that is capable of high-speed operation whose speed is the order of several tens of gigahertz, the over-sampling ratio is improved by 10 through 100 times as compared with a case where a modulator circuit is formed by a semiconductor circuit. Accordingly, it is possible to expect a dramatic improvement in bit accuracy.

FIG. 2A is a diagram illustrating as an example an equivalent circuit of a sigma-delta modulator 200 based on the SFQ circuit. The circuit includes: an integration circuit 203 that is constituted of an integration resistor 201 and an integrating inductor 202; and a comparator 206 that is constituted of two Josephson junctions 204, 205. First of all, an inputted analog signal 210 is integrated by the integration circuit 203. The result of the integration appears as a circular current 211 flowing through the integrating inductor 202. This circular current 211 is inputted into the comparator 206. As a result of inputting a SFQ clock signal 212 that is used as a sampling signal, the circular current 211 is compared with a threshold value specific to the comparator 206. The result of the comparison is then output as a SFQ data signal 213. The comparator 206 feeds back this result to the integration circuit 203. Incidentally, besides the analog signal 210, an offset current is inputted into the integration circuit 203 from an offset current source 207.

Here, how the comparator 206 operates will be described. The circular current 211 of the integration circuit 203, which is a current to be compared, is branched into two: one flows through the Josephson junction 204, and the other flows through the Josephson junction 205. If the SFQ clock signal 212 is inputted into the comparator 206 with the above state being kept unchanged, a new circular current 214 caused by the SFQ clock signal flows through the Josephson junctions 204, 205. In this case, the circular current 211 from the integration circuit 203 and the circular current 214 caused by the SFQ clock signal 212 flow through the Josephson junction 205 in the same direction. On the other hand, the circular current 211 and the circular current 214 flow through the Josephson junction 204 in directions that are opposite to each other.

If the circular current 211 of the integration circuit 203 exceeds a threshold value of the comparator 206, a value obtained by totaling the circular current 214 caused by the SFQ clock signal 212 flowing through the Josephson junction 205 and the circular current 211 of the integration circuit 203 exceeds a critical current value of the Josephson junction 205. Therefore, the Josephson junction 205 enters a voltage state for a few picoseconds, which causes a voltage pulse to occur at an output terminal of the comparator 206 for a few picoseconds. As a result, one SFQ is output from the sigma-delta modulator 200 as the quantized data signal 213. This means that a digital signal "1" has been output. Hereinafter, a series of operation relating to this Josephson junction is expressed as "a Josephson junction switches". In addition, when the Josephson junction 205 switches, a circular current which is equivalent to one SFQ also flows on the side of the integration circuit 203 in a direction that is opposite to the circular current 211 of the integration circuit which originally flows. This means that a circular current which is equivalent to one SFQ has been fed back from the comparator 206 to the integration circuit 203 side.

On the other hand, if the circular current 211 of the integration circuit 203 does not exceed a threshold value of the comparator 206, then a value obtained by totaling the circular current 214 caused by the SFQ clock signal 212 flowing through the Josephson junction 204 and the circular current 211 of the integration circuit 203 exceeds a critical current value of the Josephson junction 204. Accordingly, the Josephson junction 204 switches this time, which does not cause a voltage pulse to occur at the output terminal of the comparator 206. As a result, no SFQ is output from the comparator 206. This means that a digital signal "0" has been output from the sigma-delta modulator 200 as the quantized data signal 213. Moreover, in this case, the feedback from the comparator 206 to the integration circuit 203 also does not occur. On the basis of the principles of operation described above, integration, comparison, and feedback, which are required for the sigma-delta modulation, are achieved.

Besides the analog signal 210, an offset current is inputted from the offset current source 207 into the integration circuit 203. In general, a value of this electric current is set at 50% of the input full scale of the analog signal 210. This electric current controls the operation of the comparator when no signal is inputted as the analog signal 210. To be more specific, when no signal is inputted as the analog signal 210, a state in which "1" and "0" are alternately output is created in response to the input of the sampling clock signal (the SFQ clock signal 212). Then, the pulse density of "1" included in a digital data signal, which is output from the modulator, is set at 50%.

The delta modulation can also be explained on the basis of the principles that are substantially the same as those of the sigma-delta modulation. FIG. 2B is a diagram illustrating as an example an equivalent circuit of a delta modulator 220 based on the SFQ circuit. The circuit is substantially the same as that of the sigma-delta modulation shown in FIG. 2A. A point of difference between these circuits is that instead of directly inputting the analog signal 210 into the integration circuit 203, the analog signal 210 is inputted from the input inductor 208 that is magnetically coupled to the integrating inductor 202 of the integration circuit 203. The analog signal 210 is not subjected to the integration processing. Only a feedback signal from the comparator 206 is integrated. Because of it, only a change in the analog signal is reflected on the SFQ quantized data signal 213 that is output from the comparator 206. In order to restore from the output signal the digital signal on which the analog signal is reflected, it is necessary to place a digital integrator on the output side of the modulator.

These modulator circuits based on the SFQ circuit can be very easily implemented because the modulator circuits can be formed by a resistor, one or two inductors, and two or four Josephson junctions that are required to constitute a comparator. In addition, a SFQ signal required for the circuit operation is only the sampling clock signals. Accordingly, the SFQ signal is not restricted by the timing between two or more SFQ signals in the circuit, which is in general a problem of the SFQ circuit. For this reason, it is possible to expect that these modulator circuits achieve the highest speed operation in principles.

Regardless of whether it is a semiconductor circuit or a SFQ circuit, when an A/D converter is used, great importance is placed on the conversion accuracy thereof. As described above, in the case of the sigma-delta modulation and the delta modulation, by using noise shaping with high ratio of a sampling frequency to the frequency band of the input signal (over-sampling ratio), an efficient improvement in the conversion accuracy has been achieved.

However, because of the two causes described below, the actually acquired bit accuracy of a modulator, which is formed of a SFQ circuit, is lower than a theoretical value.

First of all, the first cause is thermal noise that occur in Josephson junctions constituting a comparator, and that occur in a resistor constituting part of an integration circuit. Basically, a Josephson junction includes a resistance component in a voltage state. Moreover, when a Josephson junction included in the SFQ circuit switches, a shunt resistor is connected to the Josephson junction to keep a voltage state unchanged for a few picoseconds. On the assumption that the resistance component is R, a root mean square of the current amplitude i of thermal noise occurring at both ends of the junction is expressed by Equation (1) as follows:

$$i^2 = \frac{4k_B TB}{R} \qquad \text{Equation (1)}$$

where $k_B$ is Boltzmann constant, T is temperature, and B is the bandwidth of noise.

The resistor of the integration circuit is also the same. However, a period of time during which the Josephson junction is kept in a resistor state (more specifically, the length of time of a voltage state) is a few picoseconds, and a resistance value of the resistor is 2 to 3 O. On the other hand, because the integration resistor always generates noise, and because a resistance value is set at several mO, its noise current is large.

If thermal noise is taken into consideration, the thermal noise overlaps quantization noise in the integration circuit, and the comparator, of the modulator. Accordingly, the bit accuracy decreases. For example, if the electric power of the quantization noise is the same as that of the thermal noise, the bit accuracy decreases by 1.0 bit.

The second cause is the integration leak that exists in the integration circuit constituted of the integration resistor and the integrating inductor. This means that it is not possible to integrate a signal whose frequency is lower than the cut-off frequency fc determined by Equation (2):

$$f_c = \frac{R}{2\pi L} \qquad \text{Equation (2)}$$

where R is a resistance value of the integration resistor, and L is the inductance of the integrating inductor. Because it is not possible to reduce quantization noise whose frequency is lower than or equal to this cut-off frequency in a modulator that uses an integration circuit constituted of an inductor and a resistor, the actually acquired bit accuracy is lower than a theoretical value obtained in a case where an integration circuit which is ideal for the modulator is used. For example, if a cut-off frequency is 1 MHz in the bandwidth of 10 MHz, a decrease in the bit accuracy is very little. However, if the cut-off frequency is 10 MHz, the bit accuracy decreases by 1 bit.

One of the methods for preventing the bit accuracy from being decreased by the integration leak is to reduce the cut-off frequency of the integration circuit. Accordingly, it is necessary to increase the inductance of the integration circuit, and also to decrease the resistance. However, the above measures have the following problems. First of all, the increase in inductance causes the bit accuracy to newly decrease. With the increase in inductance, the circular current to be fed back from the comparator circuit to the integration circuit decreases. In response to the decrease, the quantization spacing also decreases. Therefore, a value of the electric power of thermal noise occurring in the above-described Josephson junction becomes relatively larger in comparison with the quantization spacing. As a result, the influence of the thermal noise exerted upon the bit accuracy becomes larger, and accordingly the bit accuracy decreases.

On the other hand, if the resistance value is decreased, the input sensitivity of an analog signal and an offset current increase in the modulator. For example, if a sampling frequency is 10 GHz, the inductance is 40 pH, and the resistance is 1 mO, which are general circuit parameters of the sigma-delta modulator based on the SFQ circuit, the cut-off frequency becomes 4 MHz, the input full scale (amplitude) of an analog signal becomes 10.35 mA, and an offset current also becomes 10.35 mA. If the resistance value is decreased to one tenth so as to decrease a cut-off frequency, an input current and an offset current exceed 100 mA. Accordingly, the input sensitivity becomes worse. If an A/D converter is formed by a superconducting circuit, the compatibility between the high bit accuracy and the high sensitivity is indispensable.

In addition, in order to improve the bit accuracy of the above-described modulator based on the SFQ circuit, an increase in frequency of a sampling clock is required. However, there is also a limit in the operation speed of the SFQ circuit (more specifically, the response speed of the Josephson junction) (in the case of an existing circuit manufacturing process, about 40 GHz). For this reason, as a method for improving the bit accuracy (methods in which a frequency is increased are excluded), there are proposed a method in which a plurality of threshold values are used in the comparator circuit, and a method in which a plurality of comparators are arrayed, the comparators being driven in an interleaving manner.

The former method is based on the fact that the time at which a Josephson junction switches differs depending on the amount of a circular current of an integration circuit. The difference in time at which the Josephson junction switches is detected in a comparator circuit to acquire the comparison output, the number of bits of which is one or more. Because there is also a limit in response speed of the Josephson junction of this method, the detection of the difference in time at which the Josephson junction switches is also limited. For the present, the resolution of less than 2 bits is realistically used.

In the latter method, for example, by alternately driving two comparator circuits, the feedback whose frequency is doubled is performed for an integration circuit without increasing an operating frequency of each individual comparator circuit. As a result, a sampling frequency of the modulator as a whole is doubled in appearance. According to this method, by adding one comparator circuit to the conventional circuit, it is possible to double its frequency. In other words, it is possible to increase the bit accuracy by 1.5 times. However, the feedback signals from the two comparator circuits are merged into the integration circuit. After all, it is necessary to operate a merge circuit at doubled frequency. Under such constraint, an interleave modulating method cannot improve a sampling frequency as much as expected. As a result, the above-described two methods are influenced by the response speed of an element (in the case of the SFQ circuit, the Josephson junction) constituting the circuit.

SUMMARY OF THE INVENTION

The present invention has been made to solve the problems. According to the present invention, first of all, there is proposed a single flux quantum modulator circuit that includes an integration circuit whose thermal noise is reduced, and which produces no leak. The thermal noise and leak are causes that decrease the bit accuracy of the conventional SFQ modulators.

To be more specific, paying attention to the fact that because an integration circuit is formed of a resistor and an integrating inductor, the integration circuit produces the integration leak, an integration circuit according to the present invention is formed of a Josephson junction and an integrating inductor. By using the Josephson junction instead of the resistor, an effect of reducing the influence of thermal noise exerted upon the bit accuracy is also achieved. An analog input signal is inputted into the integration circuit from the input inductor that is magnetically coupled to the integrating inductor. The output of the integration circuit is applied to a comparator that is formed of a pair of junctions constituted of Josephson junctions. If the output of the integration circuit exceeds a threshold value, the output is fed back from the comparator to the integration circuit. Quantization data is obtained from a junction point between two junctions of the pair of junctions constituted of the Josephson junctions, into which the output of the integration circuit is inputted.

Because an analog signal is inputted through the input inductor, the operation of the modulator circuit basically becomes the delta modulation. For this reason, a resistor is connected to both ends of the input inductor to form an integration circuit for integrating an analog signal so that the sigma-delta modulation is achieved.

In addition, the analog signal which is inputted into the input inductor can also be inputted into an input inductor of another similar single flux quantum modulator circuit. Therefore, by connecting input inductors of a plurality of simple flux quantum modulator circuits to one another, it is possible to concurrently input one analog signal into the plurality of simple flux quantum modulator circuits. By adding up outputs of the plurality of simple flux quantum modulator circuits, it is possible to reduce the influence of thermal noise and quantization noise exerted upon the decrease in bit accuracy, the thermal noise and quantization noise occurring in each modulator circuit.

According to the present invention, because a single flux quantum circuit which uses a flux quantum as an information carrier produces no integration leak, a sigma-delta modulation circuit, or a delta modulator circuit, which is based on the single flux quantum circuit, can reduce the integration leak, thermal noise, and quantization noise. Therefore, it is possible to achieve the improvement in bit accuracy while maximizing the effectiveness of the high-speed characteristics of the SFQ circuit.

DETAILED DESCRIPTION OF THE PREFERRED EMBODIMENTS

Embodiments of the present invention will be described as below. These embodiments are merely examples to which the present invention is applied, and accordingly the present invention is not limited by the embodiments.

First Embodiment

Figure 3:
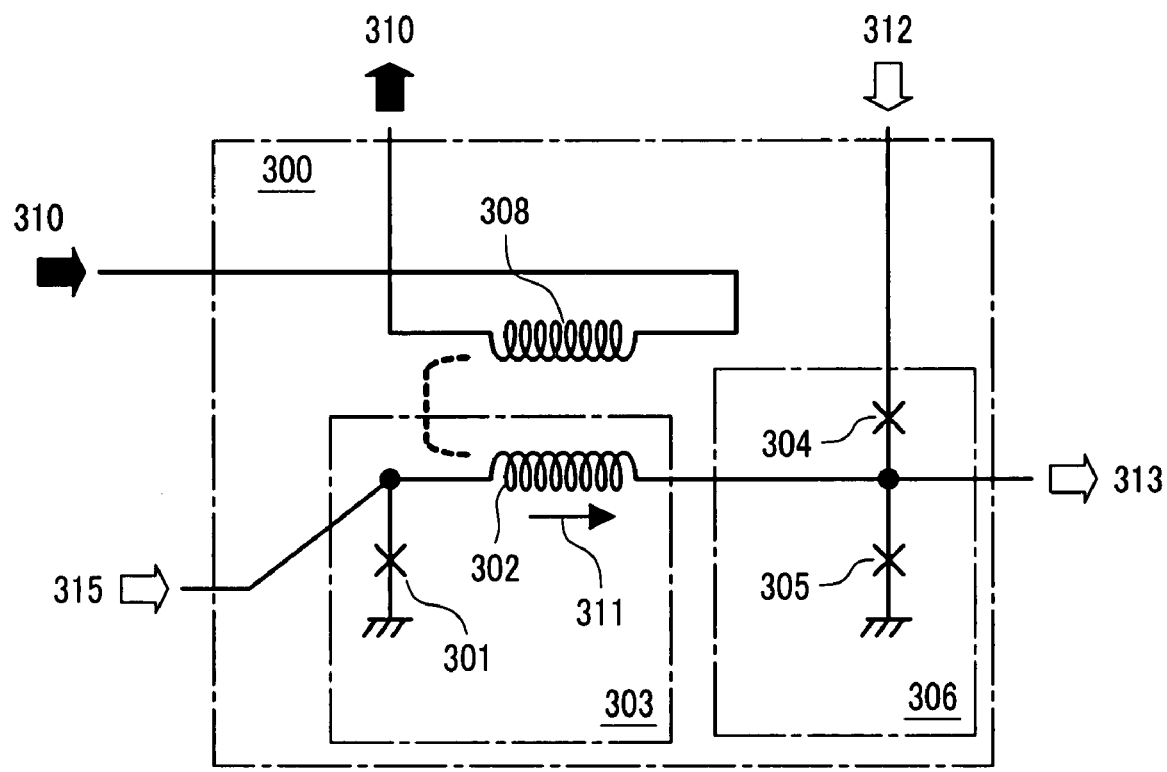
FIG. 3 is a diagram illustrating a configuration of a single flux quantum modulator circuit, which underlies the present invention.

FIG. 3 is a diagram illustrating a configuration of a single flux quantum modulator circuit 300, which underlies the present invention. The single flux quantum modulator circuit 300 includes: an integration circuit 303 that is formed of an integration inductor 302 and a Josephson junction 301; a comparator 306 that is formed of a pair of junctions constituted of Josephson junctions 304, 305, the comparator 306 being connected to the integration circuit 303; and an input inductor 308 for inputting an analog signal 310. The integrating inductor 302 and the input inductor 308 are magnetically coupled to each other. Because this circuit does not integrate the analog signal 310, this circuit executes delta modulation.

A first characteristic of the circuit shown in FIG. 3 is that no integration leak occurs. This is because the integration circuit formed of the integrating inductor 302 and the Josephson junction 301 does not include a resistor. A second characteristic of the circuit shown in FIG. 3 is the reduction in thermal noise. Thermal noise occurs even in the Josephson junction 301 included in the integration circuit. However, an electric current caused by the noise can be reduced to one tenth in comparison with a case where a resistor is used. A third characteristic of the circuit shown in FIG. 3 is that because the analog signal is inputted through the input inductor that is magnetically coupled to the integrating inductor, the sensitivity can be improved, and in addition to it, the inputted analog signal can be introduced into another single flux quantum modulator circuits 300 so that the inputted analog signal is reused.

The operation of this single flux quantum modulator circuit 300 will be described in detail as below. The pair of junctions, which forms the comparator 306, is formed by connecting the two Josephson junctions 304, 305 in series, and by grounding one end of the pair of junctions. A circular current 311 coming from the integration circuit 303, which is a target to be compared, is inputted at a junction point between these two Josephson junctions. A quantized data signal 313, which is the result of comparison, is acquired from this junction point. A threshold value of the comparator 306 is determined by a critical current value of the Josephson junctions 304, 305 that form the comparator 306. To explain the operation of the comparator 306, it is assumed that the circular current is larger than the threshold value of the comparator 306. When a SFQ clock signal 312 which is a sampling clock signal is inputted from the other end of the pair of junctions, the Josephson junction 305 switches, and consequently a quantized signal is output; more specifically, one SFQ is output from the junction point as a quantized data signal 313 (a digital truth value thereof is "1"). In addition, as a result of the switching, a circular current corresponding to one SFQ is fed back to the integration circuit 303.

On the other hand, if the circular current is smaller than the threshold value of the comparator 306, the inputted SFQ clock signal 312 causes the Josephson junction 304 to switch. As a result, SFQ is not output. A digital truth value of the quantized data signal 313 is "0". In addition, the feedback operation to the integration circuit is also not performed.

Here, how to control the offset operation of the comparator 306 at the time of no input analog signal 310 will be described. In the case of the conventional modulation circuits, an offset current whose amount is one half the full scale is applied to an integrator resistor, and the density of "1" included in a digital signal is set at 50%.

The integration circuit of the circuit shown in FIG. 3 does not include a resistor. Therefore, instead of supplying an offset current to an integration resistor in the case of the conventional modulation circuit, a SFQ offset signal 315 is inputted into the Josephson junction 301 so as to control the comparator 306. If a SFQ pulse train whose density is one half the density of the SFQ sampling clock signal 312 is inputted as the SFQ offset signal 315, the comparator at the time of no signal outputs a digital signal whose density of "1" is 50%. If the circuit shown in FIG. 3 is used, a large offset current whose value is several tens of mA becomes unnecessary. Therefore, it is possible to reduce a bad influence of leak of flux caused by the electric current, the bad influence being exerted upon the circuit. In addition, the density of a SFQ pulse of the SFQ offset signal 315 with respect to the SFQ sampling signal 312 coincides with the density of the output "1" of the comparator at the time of no signal. Therefore, by changing the density of a SFQ pulse of the SFQ offset signal 315 with respect to the SFQ sampling signal 312, it is possible to freely change the offset operation of the comparator 306. It is possible to easily obtain the SFQ offset signal 315 by dividing the SFQ sampling clock signal 312 using a counter circuit such as a toggle type flip-flop.

Second Embodiment

Figure 4:
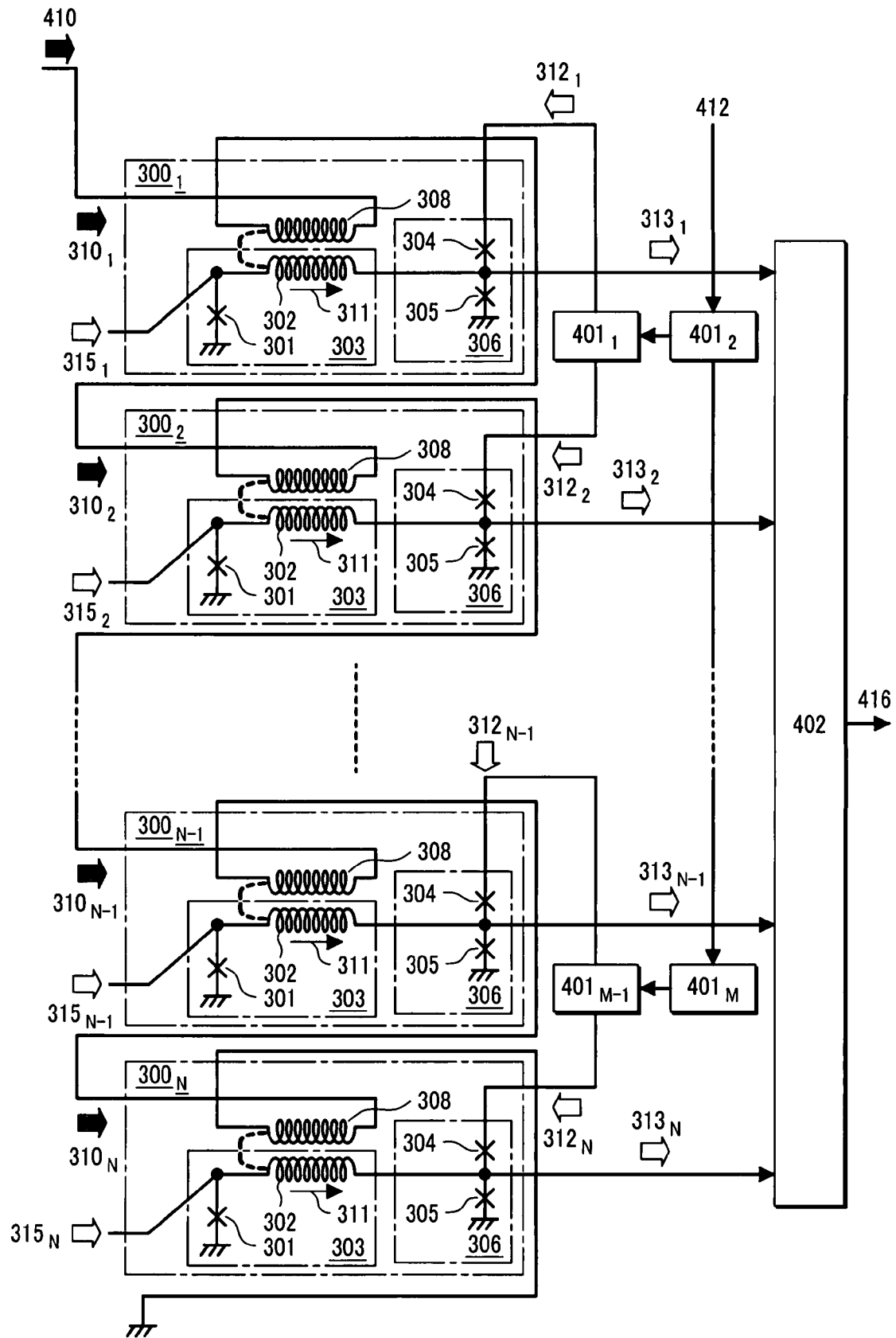
FIG. 4 is a diagram illustrating as an example a configuration in which a plurality of single flux quantum modulator circuits, one of which is shown in FIG. 3, are connected to one another so as to increase the bit accuracy.

FIG. 4 is a diagram illustrating as an example a configuration in which a plurality of single flux quantum modulator circuits 300, one of which is shown in FIG. 3 in the first embodiment, are connected to one another so as to increase the bit accuracy. A circuit shown in FIG. 4 includes circuits $300_1, 300_2, \ldots, 300_{N-1}, 300_N$, each of which is a unit circuit that is equivalent to the simple flux quantum modulator circuit 300 shown in FIG. 3. The circuit shown in FIG. 4 is formed by connecting in series the input inductor 308 of each simple flux quantum modulator circuit 300 to one another. First of all, a SFQ clock signal 412 is split by a splitter circuit $401_2$. One of the split SFQ clock signals is split by a splitter circuit $401_1$ to output split signals, which are then supplied to the single flux quantum modulator circuits $300_1, 300_2$ as SFQ clock signals $312_1, 312_2$ respectively. The other split SFQ clock signal which has been split by the splitter circuit $401_2$ is supplied to the next modulator circuit in the subsequent stage in like manner. Lastly, a SFQ clock signal which has been split by the splitter circuit $401_M$ is split by the splitter circuit $401_{M-1}$ to output SFQ clock signals $312_{N-1}, 312_N$, which are then supplied to the single flux quantum modulator circuits $300_{N-1}, 300_N$ respectively. In this case, the wire length from an input point of the SFQ clock signal 412 to each of the single flux quantum modulator circuits to which the SFQ clock signal is supplied is made the same as that from the input point to the other modulator circuits so that phases of SFQ pulses are coincide with one another.

On the other hand, a SFQ density ratio of each of SFQ offset signals $315_1, 315_2, \ldots, 315_N$ at each modulator circuit to the SFQ sampling signal (SFQ clock signal) 412 may be always 50%. However, it is not always necessary to set all of the SFQ density ratios at the same value. Moreover, all phases of SFQ pulses of the SFQ offset signals $315_1, 315_2, \ldots, 315_N$ are also not required to coincide with one another. If the SFQ offset signals $315_1, 315_2, \ldots, 315_N$ are supplied by dividing the SFQ clock signal 412, each modulator circuit may also be provided with a counter circuit so that a division ratio can be adjusted by each counter circuit.

Digital outputs $313_1, 313_2, \ldots, 313_N$, each of which is output from each modulator circuit, are inputted into an adder circuit 402. This adder circuit 402 may also be formed by a SFQ circuit. In another case, a data rate of each signal may also be decreased before each signal is transmitted to a semiconductor circuit so that the addition is made in the semiconductor circuit. Quantization data 416 is obtained from the adder circuit 402.

How the plurality of serially-connected simple flux quantum modulator circuits $300_1, 300_2, \ldots, 300_{N-1}, 300_N$ operate will be described as below. An analog signal 410 inputted from an input terminal of the simple flux quantum modulator circuit $300_1$ in the first stage becomes analog input signals $310_1, 310_2, \ldots, 310_N$ of each modulator circuit. In each modulator circuit, each analog input signal is induced into the inductor 302 of the integration circuit through the inductor 308. On the basis of the above-described operation of the simple flux quantum modulator circuit, each modulator circuit outputs digital outputs $313_1, 313_2, \ldots, 313_N$ from the comparator 306. An output signal from each modulator circuit includes a digital signal on which the inputted digital signal is reflected. In addition, an analog signal which is inputted into each modulator circuit is the same as those that are inputted into the other modulator circuits. Accordingly, as a result of the addition made N times, a power level of the output signal 416 therefrom becomes $N^2$ times an output signal obtained from one single flux quantum modulator circuit. On the other hand, thermal noise occurring in each modulator circuit may be treated as white noise. There is no correlativity between modulator circuits. Therefore, the noise power caused by the N-times addition of the thermal noise becomes N times the noise power of one simple flux quantum modulator circuit. As a result, an improvement $\Delta$ in bit accuracy achieved when the output from the modulator circuit is added N times is expressed by Equation (3) as follows:

$$\Delta = \frac{10 \log n}{6.02} \qquad \text{Equation (3)}$$

On the other hand, because quantization noise occurring in each modulator circuit depends on an instantaneous value of an analog signal, there is a correlation between modulator circuits. Accordingly, if the output of a modulator circuit into which the same analog signal has been inputted is added just as it is, a power level of quantization noise also becomes $N^2$ times. Therefore, the bit accuracy is not improved. However, in the case of the circuit shown in FIG. 4, by changing the pulse density of the SFQ offset signals $315_1, 315_2, \ldots, 315_N$ to be applied to each modulator circuit, it is possible to change operating conditions at the time of no input signal into the comparator. Therefore, between modulator circuits, each of which has the different pulse density of the SFQ offset signal 315, it is possible to decrease the correlativity of quantization noise for the same analog signal input. Accordingly, by adding up the outputs from the modulator circuits, each of which has the different pulse density or phase of the SFQ offset signal 315, the electric power of the quantization noise increases by N times. As a result, an improvement in bit accuracy achieved when the output from the modulator circuit is added N times is the same as a value calculated by Equation (3).

Third Embodiment

Figure 5:
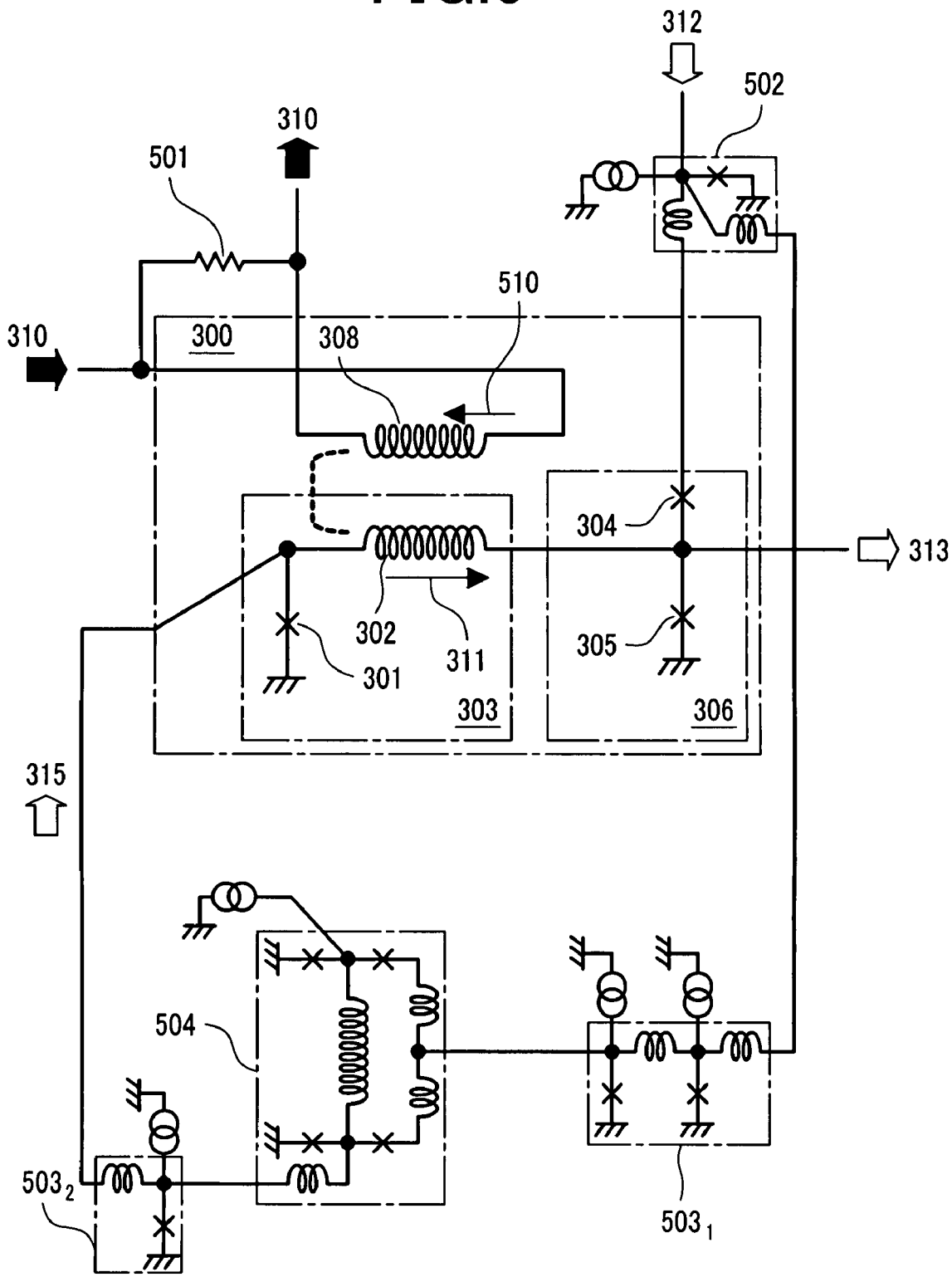
FIG. 5 is a diagram illustrating a configuration in which the single flux quantum modulator circuit shown in FIG. 3 according to the present invention is developed to a sigma-delta modulator.

FIG. 5 is a diagram illustrating a configuration in which the single flux quantum modulator circuit shown in FIG. 3 according to the first embodiment of the present invention is developed to a sigma-delta modulator. A circuit shown in FIG. 5 is formed by connecting an analog-signal integration resistor 501 to both ends of the input inductor of the single flux quantum modulator circuit 300 according to the first embodiment. How the circuit operates will be described as below.

An analog signal 310 is integrated by an analog-signal integration circuit that is formed of the input inductor 308 and the analog-signal integration resistor 501. The result of the integration is reflected on a circular current 510 that flows through the input inductor. This circular current is induced into the integrating inductor 302 of the integration circuit 303, the integrating inductor 302 being magnetically coupled to the input inductor 308. The induced circular current is then inputted into the comparator 306 as a circular current 311. In addition to the delta modulation operation of the single flux quantum modulator circuit 300 shown in FIG. 3, the circuit shown in FIG. 5 achieves the sigma-delta modulation operation by integrating the analog input signal 310 by both the input inductor 308 and the integration resistor 501. In the case of the circuit described in the first embodiment, the SFQ pulse density of the SFQ offset signal is set at 50%. In this embodiment, a one-stage toggle flip-flop circuit 504 is formed as a counter circuit. The SFQ clock signal 312 is split by a splitter circuit 502. One output signal of the splitter circuit 502 is inputted into the comparator 306 of the modulator circuit 300, whereas the other output signal is divided by two by the toggle flip-flop circuit 504, and then the SFQ offset signal 315 whose the pulse density is 50% is supplied to the integration circuit 303. Incidentally, Josephson transmission lines $503_1$, $503_2$ are used as wiring for the SFQ signal that is transmitted through the splitter circuit 502, the flip-flop circuit 504, and the integration circuit 303.

(Evaluation of the Bit Accuracy)

Figure 1A:
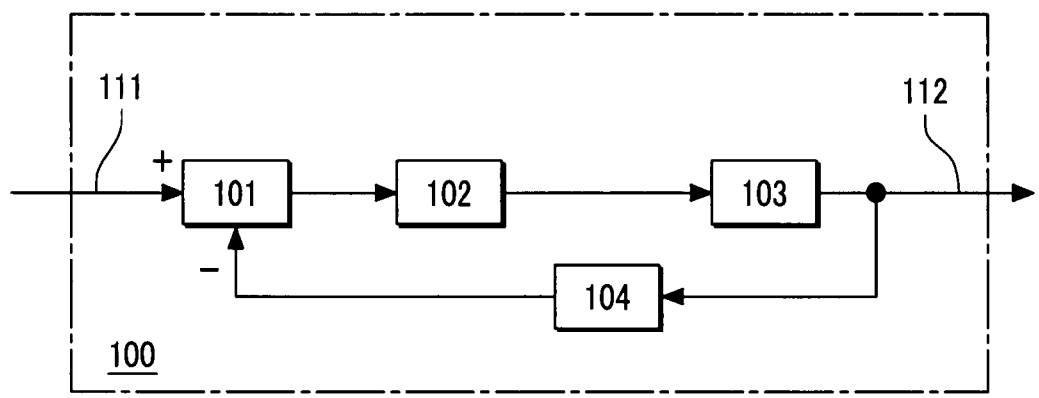
FIG. 1A is a block diagram illustrating the principles and configuration of a sigma-delta modulator.
Figure 1B:
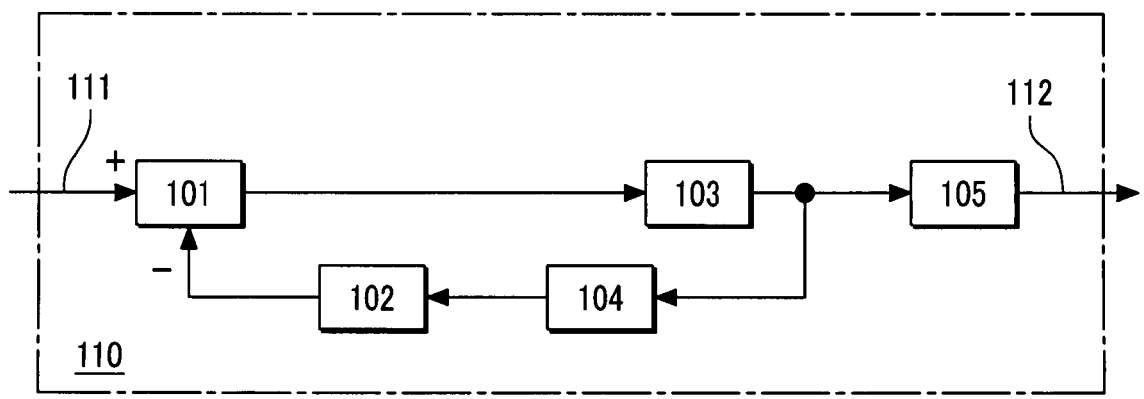
FIG. 1B is a block diagram illustrating the principles and configuration of a delta modulator.
Figure 2A:
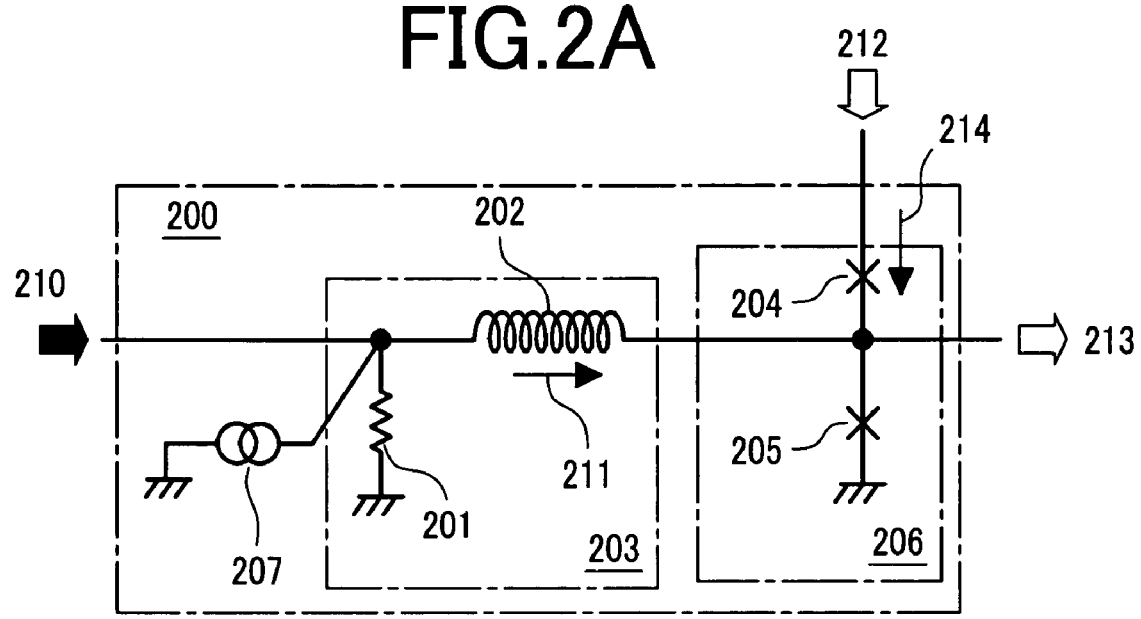
FIG. 2A is a diagram illustrating as an example an equivalent circuit of a sigma-delta modulator based on a SFQ circuit.
Figure 2B:
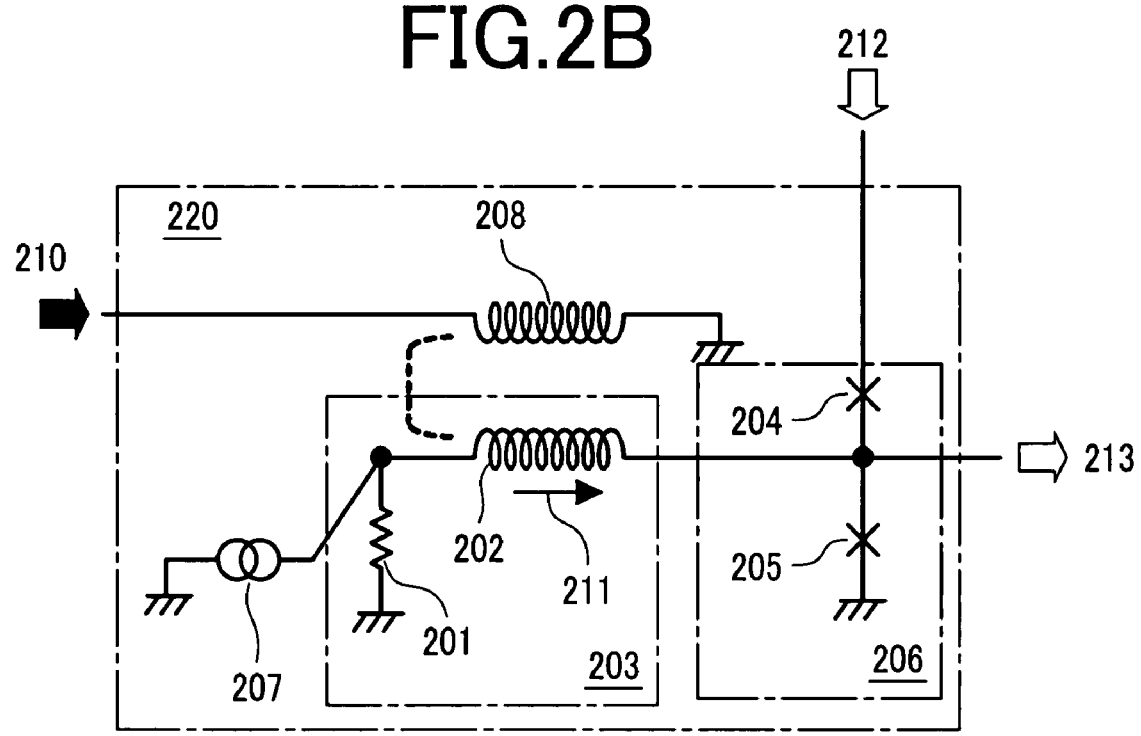
FIG. 2B is a diagram illustrating as an example an equivalent circuit of a delta modulator based on a SFQ circuit.

Next, the bit accuracy of the modulator circuit according to the third embodiment is evaluated by means of circuit simulation. In order to describe an effect of reducing the integration leak according to the present invention, a comparison with the noise shaping of a modulator configured according to the conventional art is made. The modulator circuit configured according to the conventional art is the same as that shown in FIG. 2A. The integration circuit which forms this circuit is constituted of an inductor and a resistor.

In the circuit simulation, for both of the circuits, a sinusoidal wave whose crest value is 50% of full scale, and whose frequency is 9.7 MHz, is inputted as the analog signal 310. In addition, the frequency of a sampling clock signal is set at 10 GHz. On the assumption that the operating temperature of an Nb (Niobium) superconductor circuit is 4.2 K, a thermal noise current source whose current amount is defined by Equation (1) is added to all resistor components in the circuit. A spectrum of a data SFQ signal output from the comparator is acquired by the fast Fourier transformation. Lastly, a signal-to-noise ratio of the analog signal power in the spectrum to the noise power in the bandwidth of 10 MHz is determined. Then, the bit accuracy is evaluated by the undermentioned relational expression (4) of the signal-to-noise ratio and the bit accuracy:

Bit accuracy (bit)=(SN ratio (dB)−1.76)/6.02    Equation (4)

Figure 6A:
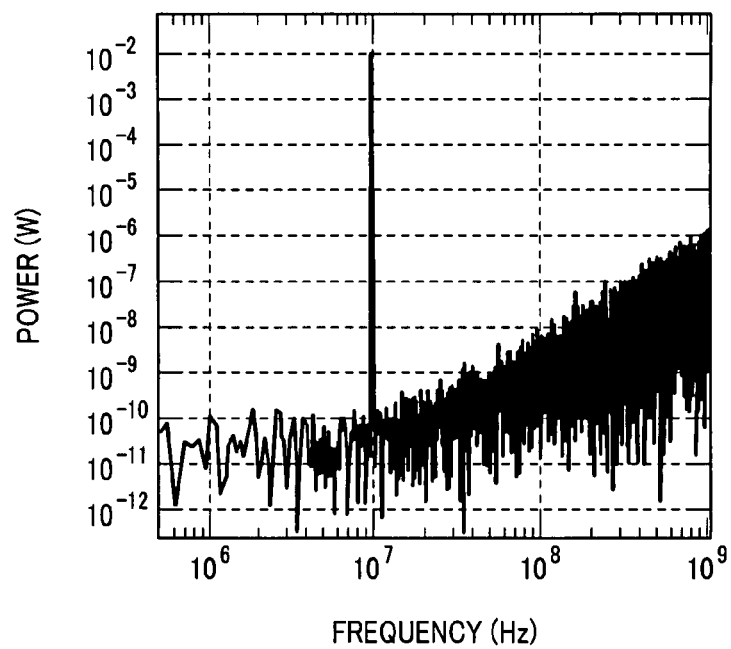
FIGS. 6A, 6B are charts each illustrating a spectrum of an output data signal of a modulator whose operating temperature is 4.2 K, the modulators corresponding to FIGS. 6A, 6B being based on the conventional art and the present invention respectively.
Figure 6B:
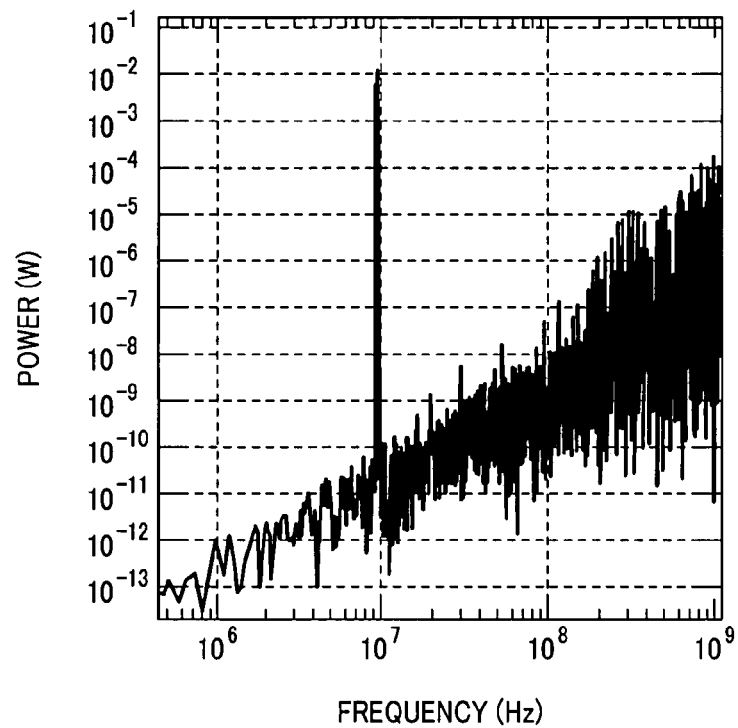

FIGS. 6A, 6B are charts each illustrating a spectrum of an output data signal of a modulator whose operating temperature is 4.2 K, the modulators corresponding to FIGS. 6A, 6B being based on the conventional art and the present invention respectively. In both FIGS. 6A, 6B, noise shaping in which a noise power level decreases with the frequency is found in a frequency band whose frequency is higher than or equal to 10 MHz. However, as understood from FIG. 6A, in the conventional art, the noise level does not decrease from a region whose cut-off frequency is about 4 MHz. In addition, the noise floor (noise floor) is also high. On the other hand, according to the present invention, as understood from FIG. 6B, the noise shaping is found even in a low frequency band whose frequency is lower than or equal to 1 MHz.

First of all, a signal-to-noise ratio is determined from the obtained frequency spectrum. A signal-to-noise ratio at the operating temperature 4.2 K in the conventional art is 71 dB. On the other hand, according to the present invention, a signal-to-noise ratio at the operating temperature 4.2 K is 78 dB. Judging from the above result, it is found that the present invention makes it possible to improve the signal-to-noise ratio by 7 dB at the operating temperature 4.2 K. Equation (4) shows that if the accuracy is expressed in terms of the bit accuracy, it is possible to improve the accuracy by 1.2 bits.

Fourth Embodiment

Figure 7:
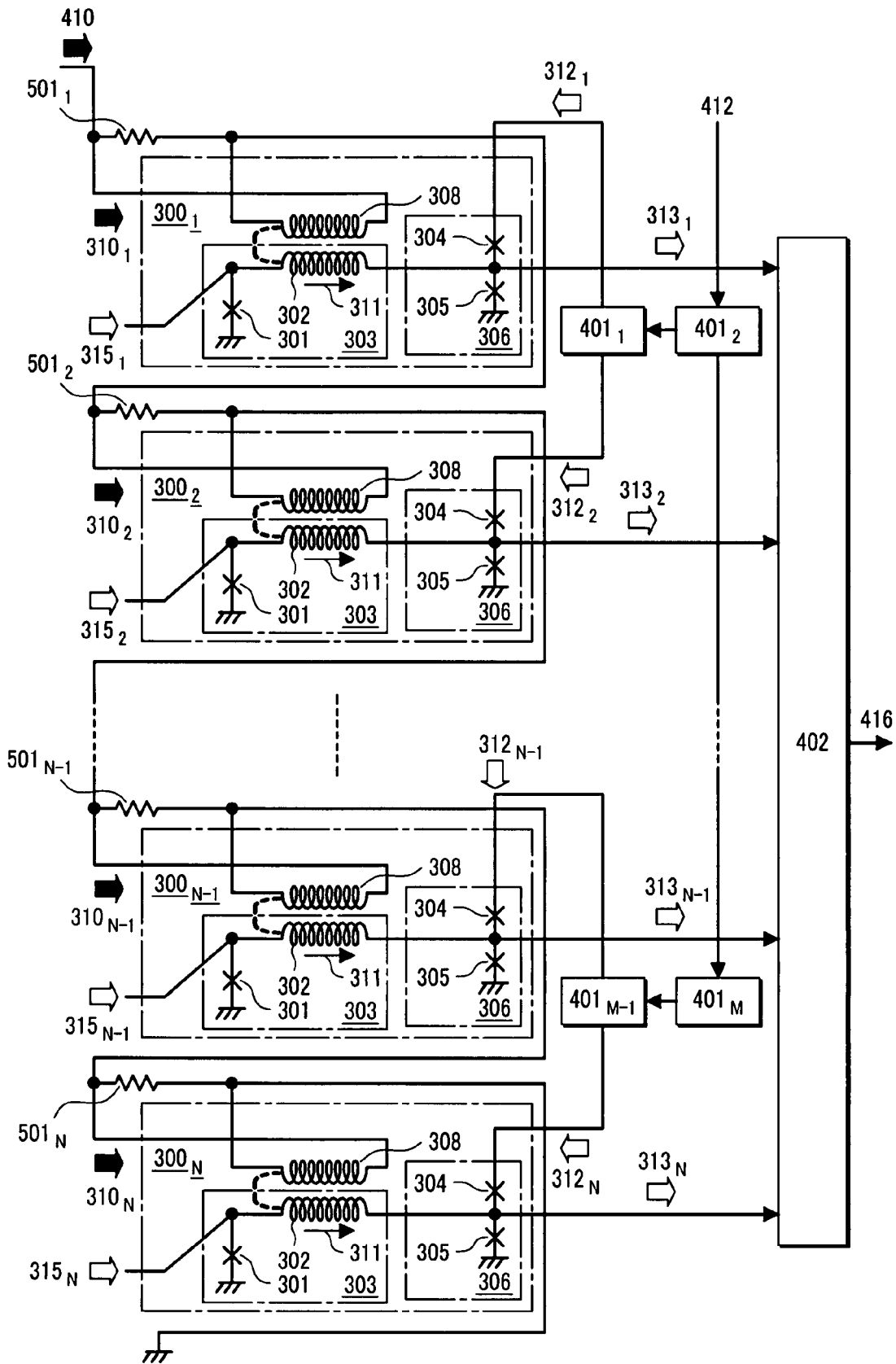
FIG. 7 is a diagram illustrating as an example a configuration in which the single flux quantum modulator circuit shown in FIG. 4 according to the present invention is developed to a sigma-delta modulator.

FIG. 7 is a diagram illustrating a configuration in which the single flux quantum modulator circuit shown in FIG. 4 according to the second embodiment of the present invention is developed to a sigma-delta modulator. A circuit shown in FIG. 7 is formed by connecting the integration resistor 501 to both ends of the input inductor of the single flux quantum modulator circuit 300 according to the second embodiment. By use of the integration resistor that is connected to each input inductor in parallel, an integration circuit used for an analog signal is formed in each single flux quantum modulator circuit. The analog signal 310 is integrated by the analog-signal integration circuit. Then, the result of the integration is reflected on the circular current 510 that flows through the input inductor. As a result, each single flux quantum modulator circuit executes a sigma-delta modulation circuit.

Figure 8:
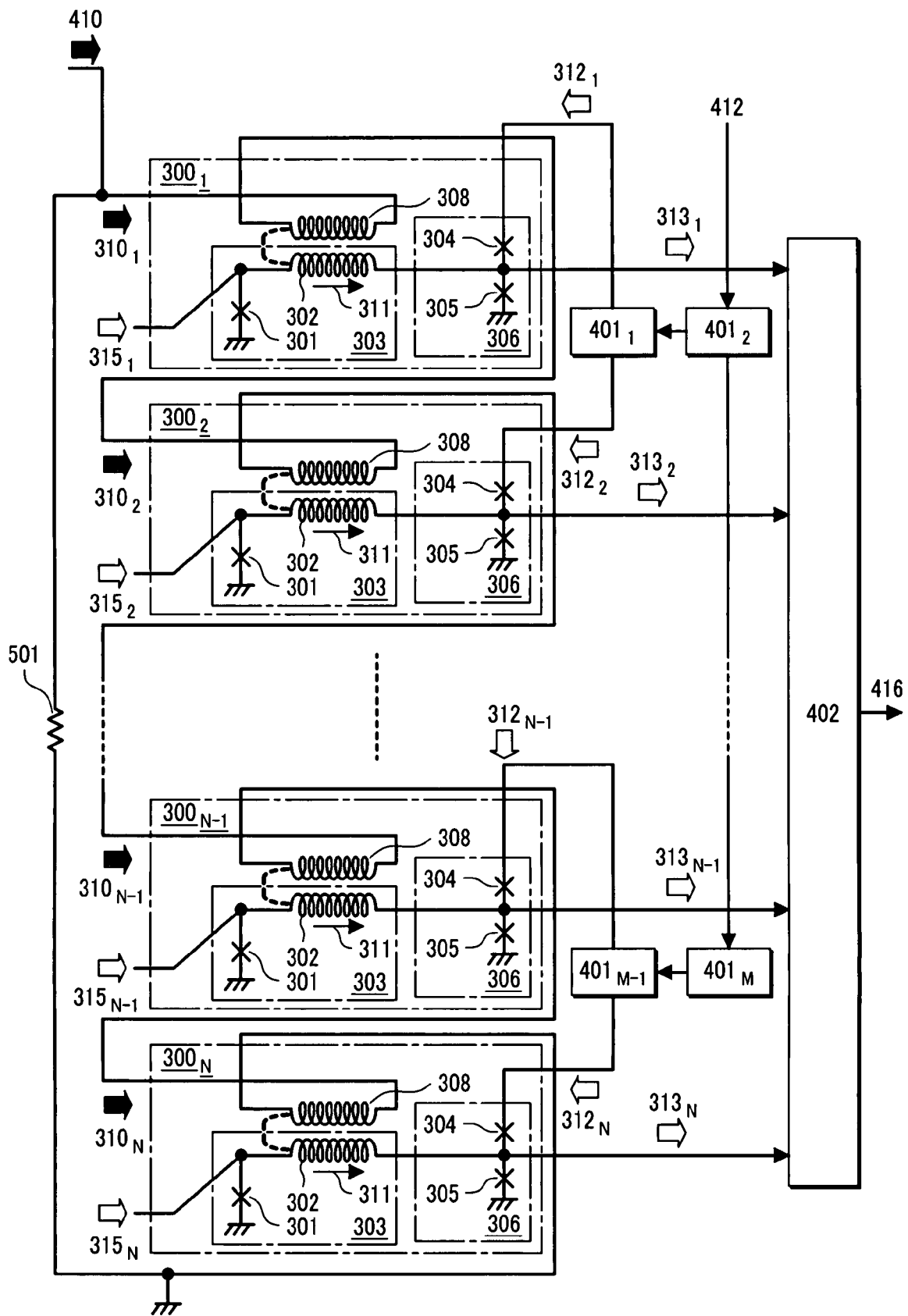
FIG. 8 is a diagram illustrating as another example a configuration in which the single flux quantum modulator circuit shown in FIG. 4 according to the present invention is developed to a sigma-delta modulator.

In addition, FIG. 8 is a diagram illustrating as an example a configuration in which the number of integration resistors is reduced to one. An analog-signal integration circuit is formed by a plurality of input inductors and an integration resistor. More specifically, the integration resistor is used to connect in parallel the start and end points of the serially connected input inductors shown in FIG. 4 according to the second embodiment. Because the circular current 510 flowing through each input inductor corresponds to an integration value of the analog signal, as is the case with the third embodiment, each single flux quantum modulator circuit executes the sigma-delta modulation.

Fifth Embodiment

Figure 9:
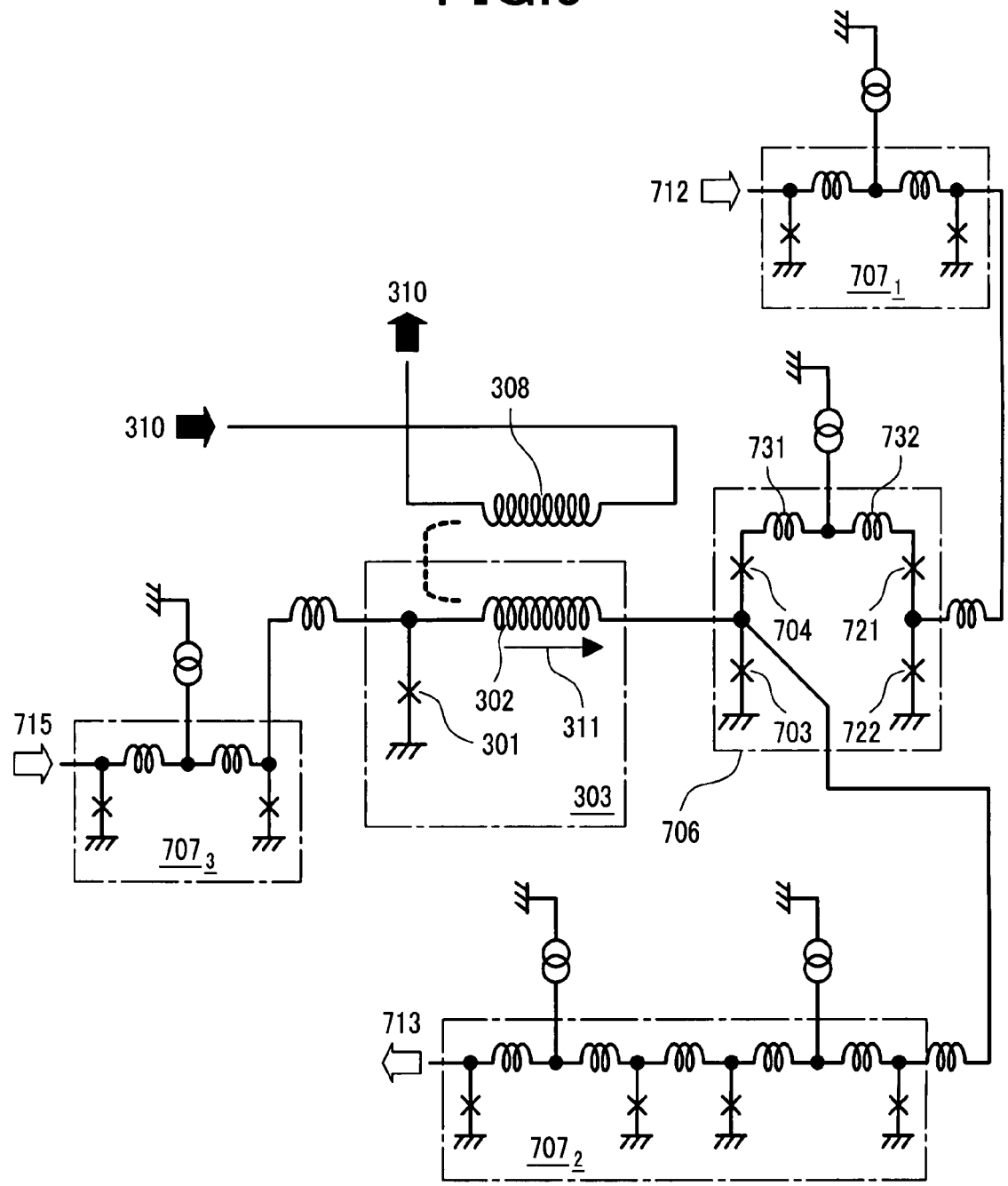
FIG. 9 is a diagram illustrating a circuit that is configured on the assumption that a single flux quantum modulator circuit is formed of a HTS (High Tc Superconductor)

FIG. 9 is a diagram illustrating a circuit that is configured on the assumption that a single flux quantum modulator circuit is formed of a HTS (High Tc Superconductor). The circuit shown in FIG. 9 similarly functions as the single flux quantum modulator circuit 300 shown in FIG. 3. However, with the objective of configuring the circuit that is suitable for the HTS, the circuit configuration shown in FIG. 3 is partially changed. First of all, a four-junction balanced comparator, which is suitable for a HTS SFQ circuit, is used as a comparator 706. A SFQ data signal coming from the comparator is output through a Josephson transmission line. Here, reference numerals 703, 704 denote Josephson junctions, which constitute a pair of Josephson junctions. In addition, reference numerals 721, 722 also denote Josephson junctions, which constitute a pair of Josephson junctions. The two pairs of Josephson junctions are connected in parallel through inductors 731, 732 to form the four-junction balanced comparator 706. Reference numerals $707_1$, $707_2$, $707_3$ denote Josephson transmission lines. Reference numeral 712 denotes a SFQ clock signal (sampling SFQ signal); reference numeral 713 denotes a quantized data signal that is the output; and reference numeral 715 denotes an SFQ offset signal. Reference numeral 310 denotes an analog input signal.

Figure 10A:
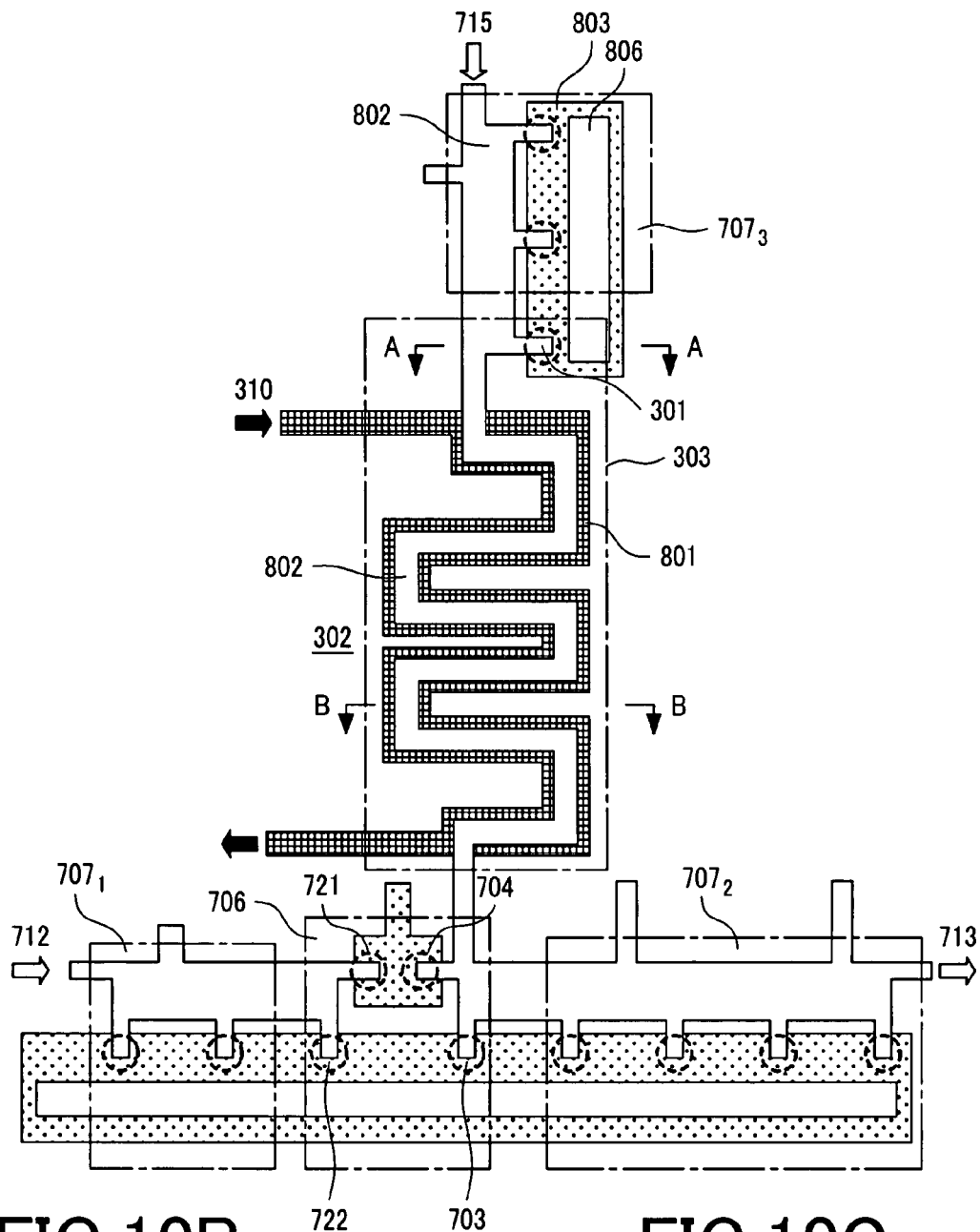
FIG. 10A is a diagram illustrating a circuit layout in which an equivalent circuit shown in FIG. 7 is configured on the basis of a manufacturing process of HTS.
Figure 10B:
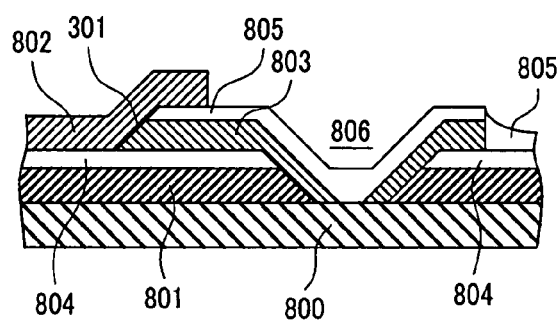
FIG. 10B is a cross sectional view in which the structure which is characterized by a Josephson junction 301 is viewed in an arrow direction at a position of A-A.

FIG. 10A is a diagram illustrating a circuit layout in which an equivalent circuit shown in FIG. 9 is configured on the basis of a manufacturing process of HTS; FIG. 10B is a cross sectional view in which the structure which is characterized by the Josephson junction 301 is viewed in an arrow direction at a position of A-A; and FIG. 10C is a cross sectional view in which the structure which is characterized by the input inductor 308 and the integrating inductor 302 is viewed in an arrow direction at a position of B-B.

As shown in FIG. 10B, the circuit includes one-layer ground plane 801, two-layer superconducting layer (a base electrode 803, a counter electrode 802), and required inter-layer insulators 804, 805. These elements are formed on a substrate 800. The Josephson junction 301 is formed by a ramp edge at which the counter electrode 802 rides on the base electrode 803. A critical current value of the Josephson junction is determined by the line width of the counter electrode 802. One end of the Josephson junction 301 is grounded through a contact hole 806 whose area of a sloping surface portion is sufficiently large. In the sloping surface portion, the base electrode 803 rides on the ground plane 801. Incidentally, although not indicated in the layout shown in FIG. 10, by making the line width of the counter electrode 802 which rides on the base electrode 803 sufficiently larger than Josephson junctions, it is possible to form a contact between the base electrode 803 and the counter electrode 802.

Figure 10C:
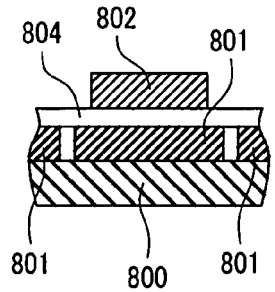
FIG. 10C is a cross sectional view in which the structure which is characterized by the input inductor 308 and the integrating inductor 302 is viewed in an arrow direction at a position of B-B.

As shown in FIG. 10C, the input inductor 308 is formed by partially separating a layer of the ground plane 801, and a counter layer 802 is formed thereon. As a result, the integrating inductor 302 is formed. This configuration makes it possible to magnetically couple the input inductor 308 to the integrating inductor 302.

Incidentally, because a resistor is not indicated in the circuit of FIG. 9, a configuration of the resistor has not been described in FIG. 10. However, needless to say, those skilled in the art, who are accustomed to handling high Tc superconductors, can easily implement required resistors.

The circuit operation is the same as that shown in FIG. 3 except the operation of the comparator 706. The operation of the comparator 706 will be described as below. When the SFQ clock signal 712 is inputted, the Josephson junction 722 of the comparator 706 switches. At this time, one SFQ is inputted into the comparator 706. If the circular current 311 of the integration circuit 303, which is a current to be compared, is smaller than a threshold value of the comparator 706, the Josephson junction 704 switches, and consequently the SFQ data signal 713 is not output from an output terminal. On the other hand, if the current to be compared is larger than or equal to the threshold value of the comparator 706, the Josephson junction 703 switches, and consequently the SFQ data signal 713 is output. As is the case with the first embodiment, if the SFQ is not output from the output terminal as a quantized data signal within a period of time that is equivalent to one period of the SFQ clock signal 712, then the output is defined as digital data "0", whereas if the SFQ is output, the output is defined as digital data "1".

Figure 11:
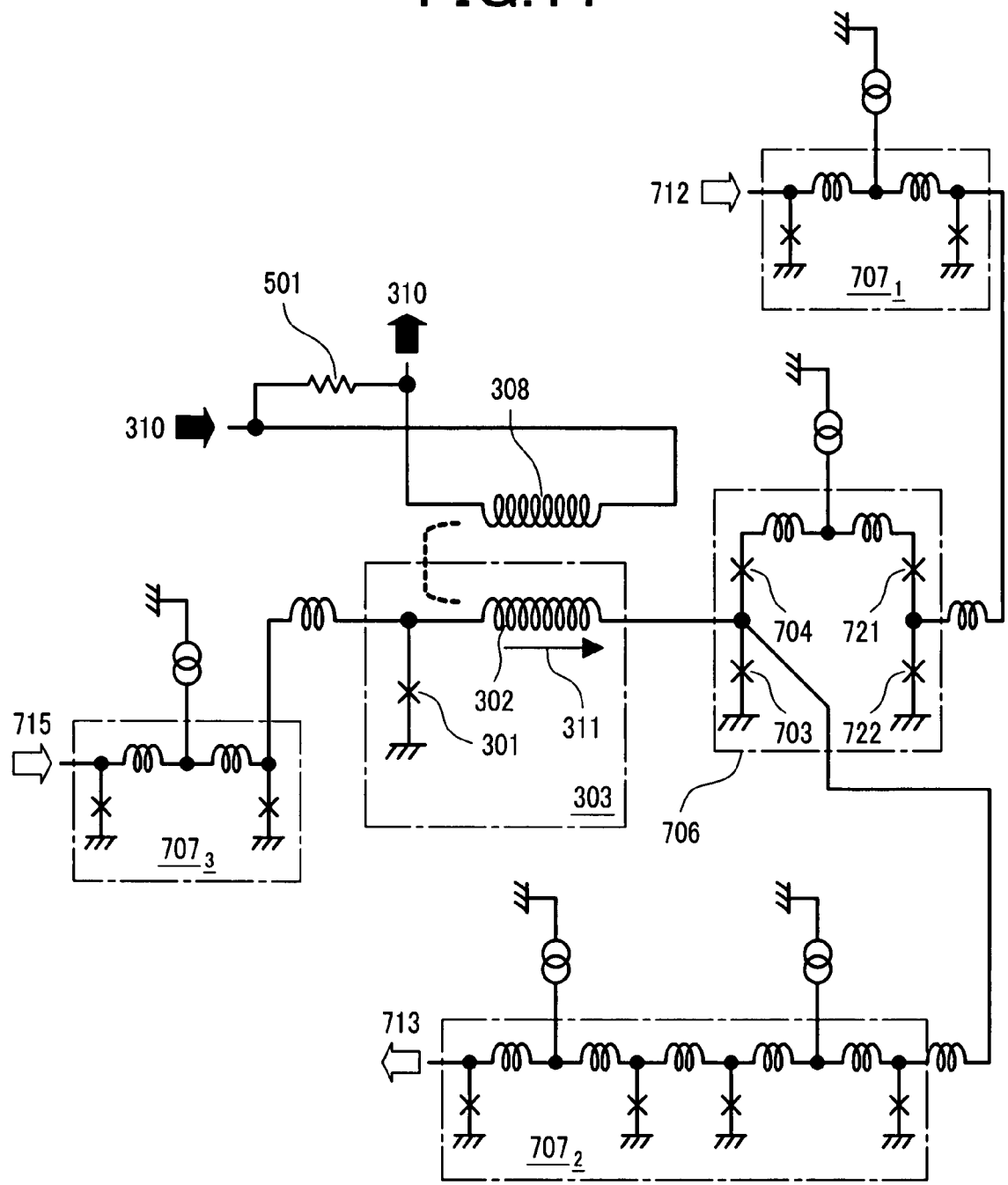
FIG. 11 is a diagram illustrating as an example a configuration in which the single flux quantum modulator circuit shown in FIG. 9 according to the present invention is developed to a sigma-delta modulator.

The single flux quantum modulator circuit described in the fifth embodiment executes the delta modulation. If the single flux quantum modulator circuit is required to function as a sigma-delta modulator, the resistor has only to be connected to the input inductor in parallel as described in the third embodiment to configure a circuit shown in FIG. 11.

In addition, as described in the second embodiment, it is possible to connect the plurality of single flux quantum modulator circuits described in the fifth embodiment to one another. Moreover, it is also possible to execute the sigma-delta modulation by connecting in parallel the integration resistor described in the fourth embodiment to the input inductor.

Sixth Embodiment

A sixth embodiment will be described as below. In the sixth embodiment, two single flux quantum modulator circuits shown in FIG. 3 according to the first embodiment of the present invention are connected to each other to form a sigma-delta modulation circuit.

Figure 12:
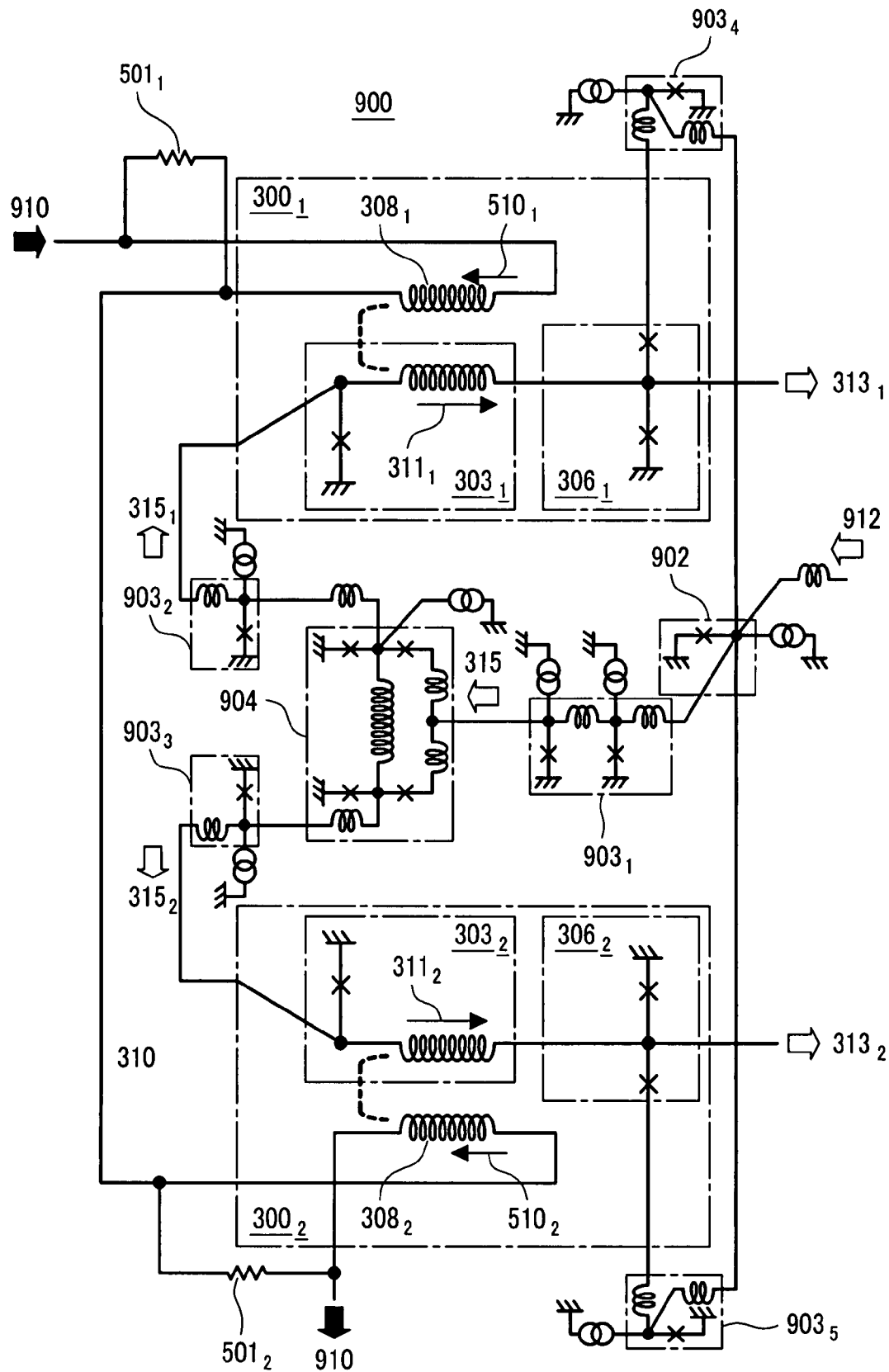
FIG. 12 is a diagram illustrating an embodiment of a sigma-delta modulation circuit 900 that is constituted of two single flux quantum sigma-delta modulation circuits 300, each of which includes the single flux quantum modulator circuit 300 and the integration resistor 501, which are shown in FIG. 5.

FIG. 12 is a diagram illustrating an embodiment of a sigma-delta modulation circuit 900 that is constituted of two single flux quantum sigma-delta modulation circuits 300, each of which includes the single flux quantum modulator circuit 300 and the integration resistor 501, which are shown in FIG. 5. By connecting in series the input inductors $308_1$, $308_2$ of each of the modulator circuits $300_1$, $300_2$, the same analog signal 910 is concurrently inputted. In addition, a SFQ clock signal 912 which is used as a sampling signal is split by a splitter circuit 902. Then, the split signals are concurrently inputted into the modulator circuits $300_1$, $300_2$ through the Josephson transmission lines $903_4$, $903_5$ respectively. On the other hand, by using a toggle flip-flop circuit 904 to convert the SFQ clock signal, into SFQ offset signals $315_1$, $315_2$ whose phases differ from each other by 180°, the phases of the SFQ offset signals $315_1$, $315_2$ to be supplied to the two modulator circuits $300_1$, $300_2$ are shifted from each other. As a result, it is possible to decrease the correlativity of quantization noise occurring in each modulator circuit.

The quantized data signals $313_1$, $313_2$ are obtained from the modulator circuits $300_1$, $300_2$ as output signals respectively. The output signals include a digital signal on which the inputted analog signal 910 is reflected. In addition to it, an analog signal which is inputted into the modulator circuit $300_1$ is the same as that inputted into the modulator circuit $300_2$. Accordingly, as a result of adding up the signals of the two modulator circuits, its signal power level becomes four times (=2² times) a quantized data signal of the single modulator circuit. On the other hand, thermal noise occurring in each modulator circuit may be treated as white noise. There is no correlativity between the modulator circuits. Accordingly, as a result of adding up the thermal noise of the two modulator circuits, the noise power becomes twice the electric power of the quantization noise in the single modulator circuit. By adding up the outputs from the two modulator circuits, a ratio of the noise power to the signal power is improved by twice (3 dB); and an improvement in bit accuracy is 0.5 bits, which is calculated by Equation (3).

Seventh Embodiment

A seventh embodiment will be described as below. In the seventh embodiment, four single flux quantum modulator circuits shown in FIG. 3 according to the first embodiment of the present invention are connected to each other to form a sigma-delta modulation circuit.

Figure 13:
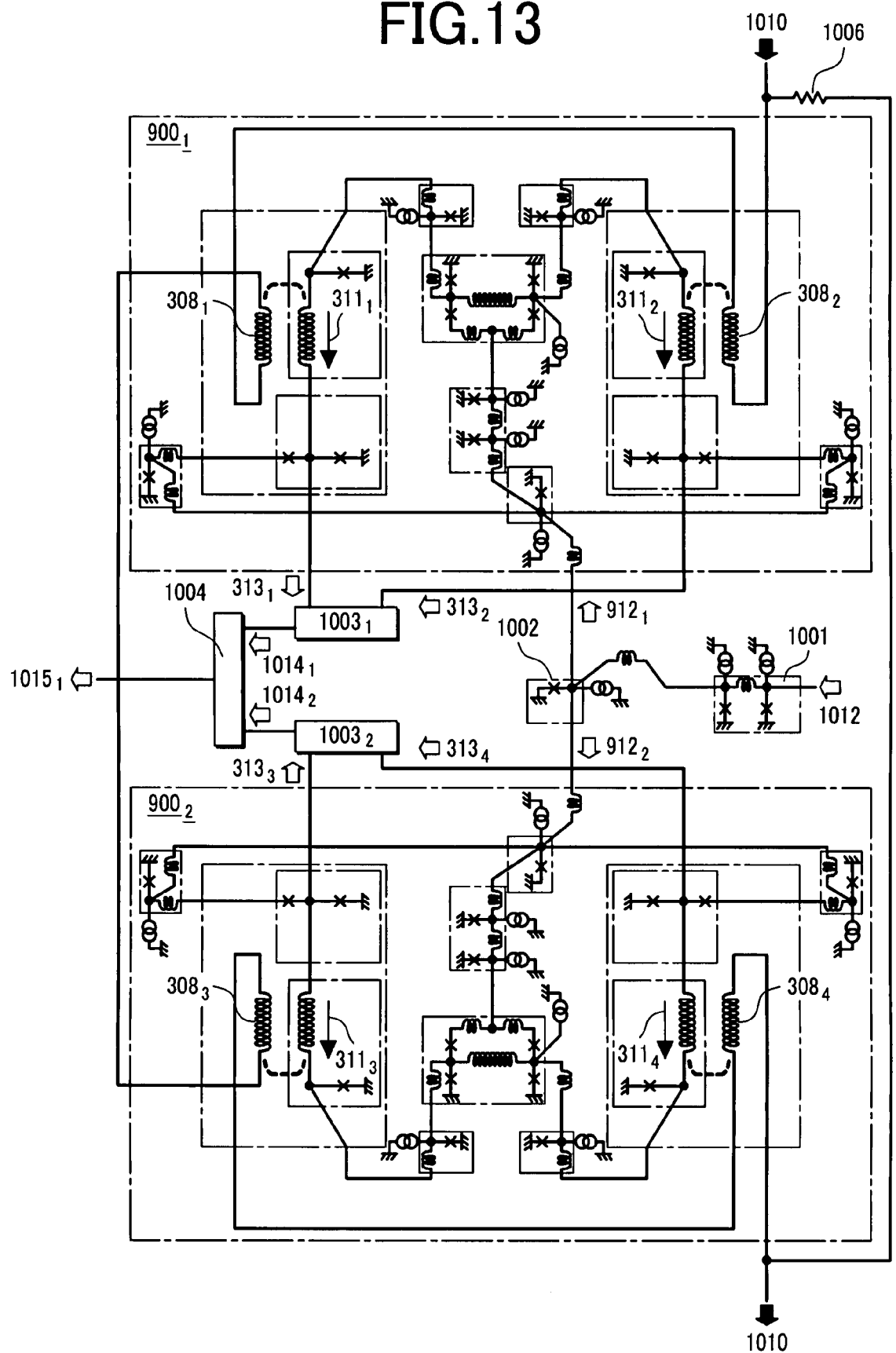
FIG. 13 is a diagram illustrating an example of a sigma-delta modulation circuit that is constituted of the two single flux quantum sigma-delta modulation circuits 900 shown in FIG. 12.

FIG. 13 is a diagram illustrating an example of a sigma-delta modulation circuit that is constituted of the two single flux quantum sigma-delta modulation circuits 900 shown in FIG. 13 in the sixth embodiment. As is the case with the fourth embodiment, by connecting in series the input inductors 308₁, 308₂ of each of the modulator circuits 900₁, 900₂, an analog signal 1010 is concurrently inputted into the modulator circuits 900₁, 900₂. However, in contrast to the sixth embodiment, the connections are made so that the circular current 311 corresponding to an analog signal flows in the modulator circuit 900₁ in a direction opposite to that of the circular current 311 flowing in the modulator circuit 900₂. Moreover, in contrast to the sixth embodiment, the analog-signal integration resistor 501 is omitted. Instead of it, an integration resistor 1006 is connected between the two modulator circuits 900₁, 900₂. This makes it possible to decrease the number of integration resistors. On the other hand, the SFQ clock signal 1012, which is used as a sampling signal, is split by the splitter circuit 1002. Then, the split signals are concurrently inputted into the modulator circuits 900₁, 900₂.

Quantized data signals 313₁, 313₂, 313₃, 313₄ are obtained from the modulator circuits 900₁, 900₂ as output signals. The output signals include a digital signal on which the inputted analog signal is reflected. In addition to it, the current level of four analog signals which are inputted into the modulator circuit 300₁, 300₂ is the same. Here, outputs of the modulator circuits, whose directions of the circular current 511 are the same (more specific, the quantized data signals 313₁, 313₂ or the quantized data signals 313₃, 313₄), are added up by adder circuits 1003₁, 1031₂. Added quantized data signals 1014₁, 1014₂ obtained by both of the adder circuits 1003₁, 1003₂ include a quantized data signal on which analog signals whose directions are opposite to each other are reflected. Therefore, by making a subtraction of both of the added quantized data signals by a subtracting circuit 1004 (for example, by subtracting the added quantized data signal 1014₂ from the added quantized data signal 1014₁), a quantized data signal 1015 is finally acquired. The signal power level of the final signal 1015 becomes 16 times (=4² times) the quantized data signal 313 of the single modulator circuit. On the other hand, thermal noise occurring in each modulator circuit may be treated as white noise. There is no correlativity between the modulator circuits 900₁, 900₂. Accordingly, as a result of the addition and subtraction of the thermal noise, the noise power becomes four times the electric power of the quantization noise in the single modulator circuit. As a result, a ratio of the signal power to the noise power is four times (6 dB); and an improvement in bit accuracy is 1 bit, which is calculated by Equation (3).

EXPLANATIONS OF LETTERS OR NUMERALS

100 . . . Sigma-delta modulator
101 . . . Adder circuit
102 . . . Integration circuit
103 . . . Comparator circuit
104 . . . One-bit D/A conversion circuit
105 . . . Digital integration circuit
110 . . . Delta modulator
111 . . . Analog signal
112 . . . Quantized data signal
200 . . . Sigma-delta modulation circuit
201 . . . Integration resistor
202 . . . Integrating inductor
203 . . . Integration circuit
204, 205 . . . Josephson junction
206 . . . Comparator
207 . . . Offset current source
208 . . . Input inductor
210 . . . Analog signal
211 . . . Circular current
212 . . . SFQ clock signal
213 . . . Quantized data signal
214 . . . Circular current
220 . . . Delta modulator circuit
300 . . . Single flux quantum modulator circuit
301 . . . Josephson junction
302 . . . Integrating inductor
303 . . . Integration circuit
304, 305 . . . Josephson junction
306 . . . Comparator
308 . . . Input inductor
310 . . . Analog signal
311 . . . Circular current
312 . . . SFQ clock signal
313 . . . Quantized data signal
315 . . . SFQ offset signal
401 . . . Splitter circuit
402 . . . Adder circuit
410 . . . Analog signal
412 . . . SFQ clock signal
416 . . . Quantized data signal
501 . . . Analog-signal integration resistor
502 . . . Splitter circuit
503 . . . Josephson transmission line
504 . . . Toggle flip-flop circuit
510 . . . Circular current
703, 704 . . . Josephson junction
706 . . . Comparator
707 . . . Josephson transmission line
712 . . . SFQ clock signal
713 . . . Quantized data signal
715 . . . SFQ offset signal
721, 722 . . . Josephson junction
731, 732 . . . Inductor
800 . . . Substrate
801 . . . Ground plane layer
802 . . . Counter electrode
803 . . . Base electrode
804, 805 . . . Insulating layer
806 . . . Ground contact
902 . . . Splitter circuit
903 . . . Josephson transmission line 904 ... Toggle flip-flop circuit
910 ... Analog signal
912 ... SFQ clock signal
1001 ... Josephson transmission line
1002 ... Splitter circuit
1003 ... Adder circuit
1004 ... Subtracting circuit
1006 ... Analog input signal integration resistor
1010 ... Analog signal
1012 ... SFQ clock signal
1013 ... Quantized data signal
1014 ... Added quantized data signal
1015 ... Quantized data signal

What is claimed is:

1. A single flux quantum modulator circuit comprising:
a pair of junctions constituted of two Josephson junctions connected in series, wherein one end of one of the two Josephson junctions is grounded;
a first inductor, one end of which is connected to a junction point between the Josephson junctions constituting the pair of junctions;
a Josephson junction that is connected to the other end of the first inductor, one end of the Josephson junction being grounded; and
a second inductor that is magnetically coupled to the first inductor,
wherein:
an analog input current is applied to the second inductor; a first single flux quantum clock signal is inputted into the other end of the pair of junctions; a second single flux quantum clock signal whose period is longer than that of the first single flux quantum clock signal is inputted into a junction point between the first inductor and the Josephson junction; and a voltage signal at the junction point between the Josephson junctions constituting the pair of junctions is output as a single flux quantum pulse.

2. The single flux quantum modulator circuit according to claim 1, wherein a resistor is connected to both ends of the second inductor.

3. The single flux quantum modulator circuit according to claim 2, wherein the second single flux quantum clock signal is generated by passing the first single flux quantum clock signal through a counter circuit.

4. The single flux quantum modulator circuit according to claim 1, wherein the second single flux quantum clock signal is generated by passing the first single flux quantum clock signal through a counter circuit.

5. The single flux quantum modulator circuit according to claim 1, wherein:
a resistor is connected to both ends of the second inductor; and
the second single flux quantum clock signal is generated by passing the first single flux quantum clock signal through a toggle flip-flop circuit.

6. A single flux quantum modulator circuit comprising:
a first pair of junctions constituted of two Josephson junctions connected in series, wherein one end of one of the two Josephson junctions is grounded;
a second pair of junctions constituted of two Josephson junctions connected in series, wherein one end of one of the two Josephson junctions is grounded;
a first inductor, one end of which is connected to a junction point between the Josephson junctions constituting the first pair of junctions;
a Josephson junction that is connected to the other end of the first inductor, one end of the Josephson junction being grounded; and
a second inductor that is magnetically coupled to the first inductor,
wherein:
an analog input current is applied to the second inductor; the other end of the first pair of junctions is connected to the other end of the second pair of junctions through a third inductor; a first single flux quantum clock signal is inputted into a junction point between the Josephson junctions constituting the second pair of junctions; a second single flux quantum clock signal whose period is longer than that of the first single flux quantum clock signal is inputted into a junction point between the first inductor and the Josephson junction; and a voltage signal at the junction point between the Josephson junctions constituting the first pair of junctions is output as a single flux quantum pulse.

7. The single flux quantum modulator circuit according to claim 6, wherein a resistor is connected to both ends of the second inductor.

8. The single flux quantum modulator circuit according to claim 7, wherein the second single flux quantum clock signal is generated by passing the first single flux quantum clock signal through a counter circuit.

9. The single flux quantum modulator circuit according to claim 6, wherein the second single flux quantum clock signal is generated by passing the first single flux quantum clock signal through a counter circuit.

10. A single flux quantum modulator circuit comprising:
a pair of junctions constituted of two Josephson junctions connected in series, wherein one end of one of the two Josephson junctions is grounded;
a first inductor, one end of which is connected to a junction point between the Josephson junctions constituting the pair of junctions;
a Josephson junction that is connected to the other end of the first inductor, one end of the Josephson junction being grounded; and
a second inductor that is magnetically coupled to the first inductor,
wherein:
an analog input current is applied to the second inductor; a first single flux quantum clock signal is inputted into the other end of the pair of junctions; a second single flux quantum clock signal whose period is longer than that of the first single flux quantum clock signal is inputted into a junction point between the first inductor and the Josephson junction; and a voltage signal at the junction point between the Josephson junctions constituting the pair of junctions is output as a single flux quantum pulse;
with the single flux quantum modulator circuit being used as a unit circuit, the second inductors of a plurality of single flux quantum modulator circuits are connected to one another in series to form an inductor chain so that one analog input current flows through all of the second inductors of the plurality of single flux quantum modulator circuits;
a first single flux quantum clock signal which is inputted into the other end of the pair of junctions of each of the plurality of single flux quantum modulator circuits is obtained by distributing one single flux quantum clock signal, and periods thereof coincide with one another, and phases thereof also coincide with one another;
a second single flux quantum clock signal which is inputted into a junction point between the first inductor and the Josephson junction of each of the plurality of single flux quantum modulator circuits divides the first single flux quantum clock signal, the second single flux quantum clock signal having a period that is longer than that of the first single flux quantum clock signal, and the periods and phases of the second single flux quantum clock signal differing from one another; and a voltage signal at the junction point between the Josephson junctions constituting the pair of junctions of each of the plurality of single flux quantum modulator circuits is added up before the added voltage signal is output.

11. The single flux quantum modulator circuit according to claim 10, wherein a resistor is connected to both ends of every second inductor.

12. The single flux quantum modulator circuit according to claim 10, wherein a resistor is connected to the start and end points of the inductor chain in parallel.

13. A single flux quantum modulator circuit comprising:

a pair of junctions constituted of two Josephson junctions connected in series, wherein one end of one of the two Josephson junctions is grounded;

a first inductor, one end of which is connected to a junction point between the Josephson junctions constituting the pair of junctions;

a Josephson junction that is connected to the other end of the first inductor, one end of the Josephson junction being grounded; and a second inductor that is magnetically coupled to the first inductor, wherein:

a resistor is connected to the second inductor in parallel; an analog input current is applied to the second inductor; a first single flux quantum clock signal is inputted into the other end of the pair of junctions; a second single flux quantum clock signal whose period is longer than that of the first single flux quantum clock signal is inputted into a junction point between the first inductor and the Josephson junction; and a voltage signal at the junction point between the Josephson junctions constituting the pair of junctions is output as a single flux quantum pulse;

with the single flux quantum modulator circuit being used as a unit circuit, the second inductors of two single flux quantum modulator circuits are connected to each other in series to form an inductor pair so that one analog input current flows through all of the second inductors of the two single flux quantum modulator circuits;

a first single flux quantum clock signal which is inputted into the other end of the pair of junctions of each of the two single flux quantum modulator circuits is obtained by distributing one single flux quantum clock signal, and periods thereof coincide with one another, and phases thereof also coincide with one another;

a second single flux quantum clock signal which is inputted into a junction point between the first inductor and the Josephson junction of each of the two single flux quantum modulator circuits is generated by passing the one single flux quantum clock signal through a toggle flip-flop circuit;

the output of the toggle flip-flop circuit is inputted as the second single flux quantum clock signal of one of the single flux quantum modulator circuits, and the inversion output of the toggle flip-flop circuit is inputted as the second single flux quantum clock signal of the other single flux quantum modulator circuit; and a voltage signal at the junction point between the Josephson junctions constituting the pair of junctions of each of the two single flux quantum modulator circuits is added up before the added voltage signal is output.

14. A single flux quantum modulator circuit comprising:

a pair of junctions constituted of two Josephson junctions connected in series, wherein one end of one of the two Josephson junctions is grounded;

a first inductor, one end of which is connected to a junction point between the Josephson junctions constituting the pair of junctions;

a Josephson junction that is connected to the other end of the first inductor, one end of the Josephson junction being grounded; and a second inductor that is magnetically coupled to the first inductor, wherein:

an analog input current is applied to the second inductor; a first single flux quantum clock signal is inputted into the other end of the pair of junctions; a second single flux quantum clock signal whose period is longer than that of the first single flux quantum clock signal is inputted into a junction point between the first inductor and the Josephson junction; a voltage signal at the junction point between the Josephson junctions constituting the pair of junctions is output as a single flux quantum pulse;

with the single flux quantum modulator circuit being used as a unit circuit, the second inductors of two single flux quantum modulator circuits are connected to each other in series to form an inductor pair so that one analog input current flows through all of the second inductors of the two single flux quantum modulator circuits;

a first single flux quantum clock signal which is inputted into the other end of the pair of junctions of each of the two single flux quantum modulator circuits is obtained by distributing one single flux quantum clock signal, and periods thereof coincide with one another, and phases thereof also coincide with one another;

a second single flux quantum clock signal which is inputted into a junction point between the first inductor and the Josephson junction of each of the two single flux quantum modulator circuits is generated by passing the one single flux quantum clock signal through a toggle flip-flop circuit;

the output of the toggle flip-flop circuit is inputted as the second single flux quantum clock signal of one of the single flux quantum modulator circuits, and the inversion output of the toggle flip-flop circuit is inputted as the second single flux quantum clock signal of the other single flux quantum modulator circuit;

a voltage signal at the junction point between the Josephson junctions constituting the pair of junctions of each of the two single flux quantum modulator circuits is added up and then outputted;

with the two single flux quantum modulator circuits being used as a single flux quantum modulator circuit group, the inductor pairs of two single flux quantum modulator circuit groups are connected in series so that one analog input current flows through all of the inductor pairs of the two single flux quantum modulator circuit groups, directions of the analog input current flowing through the inductor pairs of the two single flux quantum circuits being opposite to each other;

a resistor is connected to both ends of each of the two serially connected inductor pairs of the two single flux quantum modulator circuit groups;

a single flux quantum clock signal which is inputted into each of the two single flux quantum modulator circuit group is obtained by distributing one single flux quantum clock signal, and periods thereof coincide with one another, and phases thereof also coincide with one another; and from the output which is obtained by adding up the output of one of the two single flux quantum modulator circuit groups, the output which is obtained by adding up the output of the other single flux quantum modulator circuit group is subtracted to output the subtracted output signal.

* * * * *